US010283600B2

(12) United States Patent
Lee et al.

(10) Patent No.: US 10,283,600 B2
(45) Date of Patent: May 7, 2019

(54) INTEGRATED CIRCUIT DEVICE

(71) Applicant: SAMSUNG ELECTRONICS CO., LTD., Suwon-Si, Gyeonggi-Do (KR)

(72) Inventors: Joon-Gon Lee, Seoul (KR); Ryuji Tomita, Yongin-Si (KR); Chul-Sung Kim, Seongnam-Si (KR); Sang-Jin Hyun, Suwon-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/871,628

(22) Filed: Jan. 15, 2018

(65) Prior Publication Data
US 2019/0043959 A1 Feb. 7, 2019

(30) Foreign Application Priority Data

Aug. 1, 2017 (KR) .................... 10-2017-0097818

(51) Int. Cl.
| H01L 29/00 | (2006.01) |
| H01L 29/417 | (2006.01) |
| H01L 29/66 | (2006.01) |
| H01L 21/8234 | (2006.01) |
| H01L 29/78 | (2006.01) |

(52) U.S. Cl.
CPC ......... H01L 29/41775 (2013.01); H01L 21/823468 (2013.01); H01L 29/6656 (2013.01); H01L 29/785 (2013.01)

(58) Field of Classification Search
None
See application file for complete search history.

(56) References Cited

U.S. PATENT DOCUMENTS

| 7,998,855 | B2 | 8/2011 | Chen |
| 8,148,775 | B2 * | 4/2012 | Gilgen ............ H01L 21/823431 |
| | | | 257/330 |
| 8,946,828 | B2 | 2/2015 | Sun et al. |
| 9,129,987 | B2 | 9/2015 | Wan et al. |
| 9,281,277 | B2 | 3/2016 | Baek et al. |
| 9,305,835 | B2 | 4/2016 | Alptekin et al. |
| 9,368,362 | B2 | 6/2016 | Rha et al. |
| 9,431,294 | B2 | 8/2016 | He et al. |
| 9,559,184 | B2 | 1/2017 | Ching et al. |
| 9,608,065 | B1 | 3/2017 | Bergendahl et al. |

(Continued)

*Primary Examiner* — Hung K Vu
(74) *Attorney, Agent, or Firm* — Volentine, Whitt & Francos, PLLC

(57) ABSTRACT

An integrated circuit device includes a substrate, a gate structure, a spacer structure, a source/drain region, and a first contact structure. The substrate includes a fin-type active region. The gate structure intersects with the fin-type active region on the substrate, and has two sides and two side walls. The spacer structure is disposed on both side walls of the gate structure and includes a first spacer layer contacting at least a portion of both side walls of the gate structure and a second spacer layer disposed on the first spacer layer and having a lower dielectric constant than a dielectric constant of the first spacer layer. The source/drain region is disposed on both sides of the gate structure. The first contact structure is electrically connected to the source/drain region and includes a first contact plug disposed on the source/drain region and a first metallic capping layer disposed on the first contact plug.

20 Claims, 25 Drawing Sheets

(56) References Cited

U.S. PATENT DOCUMENTS

| | | |
|---|---|---|
| 9,613,853 B2 | 4/2017 | Chen et al. |
| 9,679,977 B2 * | 6/2017 | Kim .................. H01L 29/41783 |
| 2009/0093100 A1 | 4/2009 | Xia et al. |
| 2011/0256676 A1 * | 10/2011 | Yun ................... H01L 21/31053 |
| | | 438/231 |
| 2015/0097291 A1 | 4/2015 | Huisinga et al. |
| 2015/0171216 A1 * | 6/2015 | Xie ..................... H01L 21/0217 |
| | | 257/401 |
| 2016/0365274 A1 | 12/2016 | Choi et al. |

\* cited by examiner

INTEGRATED CIRCUIT DEVICE

CROSS-REFERENCE TO RELATED APPLICATION

This U.S. non-provisional patent application claims the benefit of priority under 35 U.S.C. 119 to Korean Patent Application No. 10-2017-0097818, filed on Aug. 1, 2017, in the Korean Intellectual Property Office, the disclosure of which is incorporated herein in its entirety by reference.

BACKGROUND

1. Field

The present disclosure relates to an integrated circuit device. More particularly, the present disclosure relates to an integrated circuit device that includes a fin-type active region.

2. Description of Related Art

As electrical products get lighter and simpler, a demand for high integration of an integrated circuit device has increased. The down-scaling of the integrated circuit device causes a short channel effect of a transistor, which degrades the reliability of the integrated circuit device. Short channel effects occur based on size parameters of transistor elements such as the channel length, and widths of depletion-layers of the source and drain junctions. In order to reduce short channel effects, an integrated circuit device including a fin-type active region has been suggested. However, as the design rule shrinks, the size of a contact structure that provides the electrical connection to the fin-type active region is also reduced.

SUMMARY

The present disclosure describes and provides an integrated circuit device including a contact structure that provides a reliable electrical connection while having a reduced size.

According to an aspect of the present disclosure, an integrated circuit device includes a substrate, a gate structure, a spacer structure, a source/drain region, and a first contact structure. The substrate includes a fin-type active region. The gate structure intersects with the fin-type active region on the substrate, and has two sides and two side walls. The spacer structure is disposed on both side walls of the gate structure. The spacer structure includes a first spacer layer, and a second spacer layer. The first spacer layer contacts at least a portion of both side walls of the gate structure. The second spacer layer is disposed on the first spacer layer and has a lower dielectric constant than a dielectric constant of the first spacer layer. The source/drain region is disposed on both sides of the gate structure. The first contact structure is electrically connected to the source/drain region. The first contact structure includes a first contact plug and a first metallic capping layer. The first contact plug is disposed on the source/drain region. The first metallic capping layer is disposed on the first contact plug.

According to another aspect of the present disclosure, an integrated circuit device includes a substrate, a gate structure, a spacer structure, a source/drain region, and a first contact structure. The substrate includes a fin-type active region. The gate structure intersects with the fin-type active region on the substrate, and has two sides and two side walls. The spacer structure is disposed on both side walls of the gate structure and includes a low-k material. The source/drain region is disposed on both sides of the gate structure. The first contact structure is electrically connected to the source/drain region. The first contact structure includes a first contact plug disposed on the source/drain region and a first metallic capping layer disposed on the first contact plug. An upper surface of the spacer structure is at the same level as an upper surface of the first metallic capping layer.

According to another aspect of the present disclosure, an integrated circuit device includes a substrate, a gate structure, a spacer structure, a source/drain region, a first contact structure, and a second contact structure. The substrate includes a fin-type active region. The gate structure intersects with the fin-type active region on the substrate, and has two sides and two side walls. The spacer structure is disposed on both side walls of the gate structure and includes a low-k material. The source/drain region is disposed on both sides of the gate structure. The first contact structure is electrically connected to the source/drain region. The first contact structure includes a first contact plug disposed on the source/drain region and a first metallic capping layer disposed on the first contact plug. The second contact structure is electrically connected to the gate structure. The second contact structure includes a second contact plug disposed on the gate structure and a second metallic capping layer disposed on the second contact plug.

BRIEF DESCRIPTION OF THE DRAWINGS

Embodiments of the present disclosure will be more clearly understood from the following detailed description taken in conjunction with the accompanying drawings in which.

DETAILED DESCRIPTION OF THE EMBODIMENTS

Figure 1:
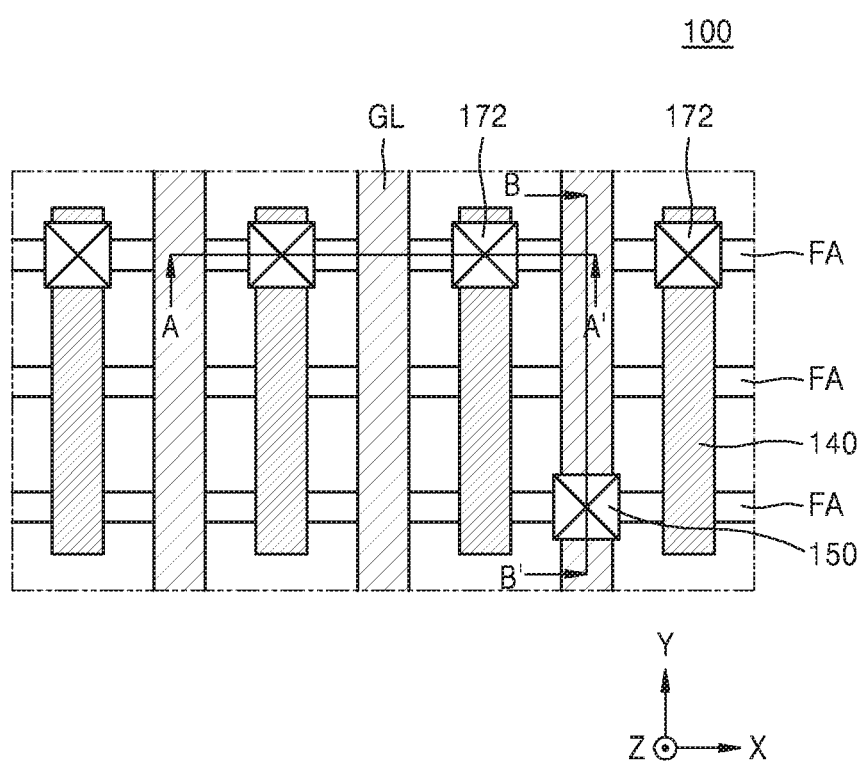
FIG. 1 illustrates a layout diagram showing an integrated circuit device according to exemplary embodiments.
Figure 2:
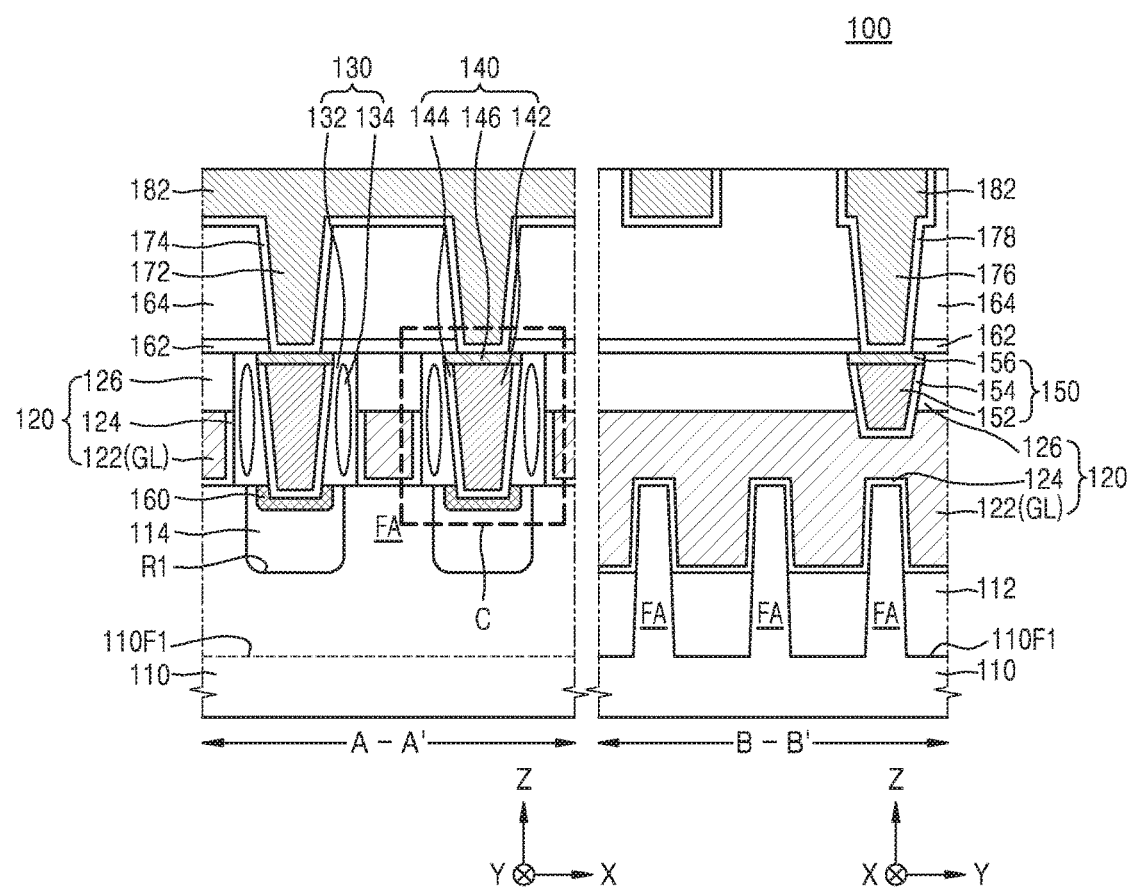
FIG. 2 illustrates a cross-sectional view taken along lines A-A' and B-B' of FIG. 1.
Figure 3:
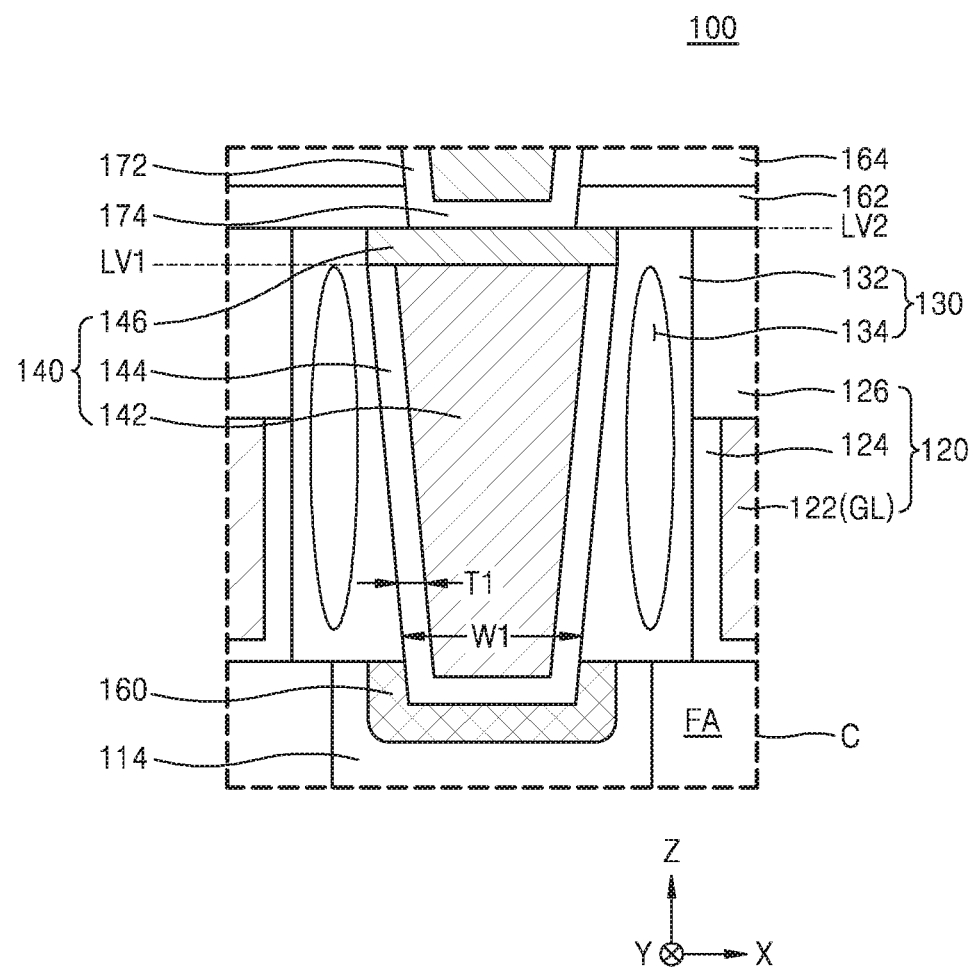
FIG. 3 illustrates an enlarged view of a region C of FIG. 2.

FIG. 1 illustrates a layout diagram showing an integrated circuit device 100 according to exemplary embodiments. FIG. 2 illustrates a cross-sectional view taken along line A-A' and line B-B' of FIG. 1, and FIG. 3 illustrates an enlarged view of a region C of FIG. 2. FIG. 1 illustrates only some elements of the integrated circuit device 100 for convenience.

Referring to FIGS. 1 to 3, a fin-type active region FA may be disposed to protrude from an upper surface 110F1 of a substrate 110. A fin-type active region derives its name from its shape as seen from at least one perspective. In FIG. 2, the cross-sectional view taken along line B-B' of FIG. 1 shows the fin-type active region(s) in the shape of fin. More particularly, the shape of a fin in three dimension/directions perpendicular to each other may be described as having the following characteristics:
  a fin may have two dimensions (e.g., height and width) that are substantially larger than the third dimension (e.g., depth)
  a cross-section of the fin showing the third dimension (e.g., depth) may show that the sides of the fin are tapered in the other dimension (e.g., height) of the three dimensions The fin-type active region FA may extend in a first direction (X direction of FIG. 1) parallel to the upper surface 110F1 of the substrate 110. For example, a dimension of the fin-type active region FA in the first direction may be larger than dimensions of the fin-type active region FA in a second direction (Y direction of FIG. 1) and/or in a third direction (Z direction of FIG. 2). Additionally, or alternatively, the fin-type active region FA may extend in the first direction entirely or substantially entirely (e.g. 90-100%) from one extremity of the integrated circuit device 100 in the first direction to an opposing extremity of the integrated circuit device 100 in the first direction.

As shown in FIG. 2, individual fins of the fin-type active region FA may extend partly but not fully through the integrated circuit device 100 in a third direction (Z direction of FIG. 2). Each fin of the fin-type active region FA has two sides and two side walls, each with a lower portion and an upper portion. An isolation layer 112 covering a lower portion of both side walls of the fin-type active region FA may be disposed on the substrate 110.

In some embodiments, the substrate 110 may include a Group IV semiconductor such as Si or Ge, a Group IV-IV compound semiconductor such as SiGe or SiC, or a Group III-V compound semiconductor such as GaAs, InAs, or InP. The substrate 110 may include a conductive region, for example, a well doped with impurities, or a structure doped with impurities. The fin-type active region FA may be an active region constituting a PMOS transistor, or an active region constituting an NMOS transistor.

A gate structure 120 extending in a second direction (Y direction of FIG. 2) parallel to the upper surface 110F1 of the substrate 110 may be disposed on the fin-type active region FA and the isolation layer 112. The gate structure 120 may include a gate electrode 122, a gate insulating layer 124, and a gate capping layer 126. The gate structure 120 may have two sides and two side walls around, along and/or aligned with a spacer structure 130 as described below.

The gate structure 120 may intersect with the fin-type active region FA on the substrate 110. For example, the gate structure 120 in FIG. 2 is shown to be above and on both lateral sides of each fin of the fin-type active region FA. Thus, the gate structure 120 in FIG. 2 overlaps each fin of the fin-type active region FA in the second direction (Y direction in FIG. 2). Additionally, the gate structure 120 partly, but not fully, overlaps each fin of the fin-type active region FA in the third direction (Z direction in FIG. 2).

The gate electrode 122 may correspond to a gate line GL extending in the second direction (Y direction of FIG. 1 and FIG. 2) as illustrated in FIG. 1. The gate electrode 122 may include a doped polysilicon, a metal, or a combination thereof. For example, the gate electrode 122 may include Al, Cu, Ti, Ta, W, Mo, TaN, NiSi, CoSi, TiN, WN, TiAl, TiAlN, TaCN, TaC, TaSiN, or a combination thereof, but is not limited thereto. In some embodiments, the gate electrode 122 may include a work function metal-containing layer and a gap-fill metal film. The work function metal-containing layer may include at least one metal selected from Ti, W, Ru, Nb, Mo, Hf, Ni, Co, Pt, Yb, Tb, Dy, Er, and Pd. The gap-fill metal film may include a W film or an Al film. In some embodiments, the gate electrode 122 may include a stacked structure of TiAlC/TiN/W, a stacked structure of TiN/TaN/TiAlC/TiN/W, or a stacked structure of TiN/TaN/TiN/TiAlC/TiN/W, but the gate electrode 122 is not limited thereto.

The gate insulating layer 124 may be disposed to extend on a bottom surface of a side wall of the gate electrode 122 in the second direction (Y direction in FIG. 2). The gate insulating layer 124 may be disposed between the gate electrode 122 and the fin-type active region FA and between the gate electrode 122 and an upper surface of the isolation layer 112. The gate insulating layer 124 may include a silicon oxide film, a silicon oxynitride film, a high dielectric film having a higher dielectric constant than the silicon oxide film, or a combination thereof. The high dielectric film may include a metal oxide or a metal oxynitride. For example, a high dielectric film capable of being used as the gate insulating layer 124 may include $HfO_2$, HfSiO, HfSiON, HfTaO, HfTiO, HfZrO, zirconium oxide, aluminum oxide, $HfO_2$—$Al_2O_3$ alloy, or a combination thereof, but is not limited thereto.

The gate capping layer 126 may be disposed on the gate electrode 122. The gate capping layer 126 may cover an upper surface of the gate electrode 122 and extend in the second direction (Y direction of FIG. 1 and FIG. 2). For example, a dimension of the gate capping layer 126 in the second direction may be larger than dimensions of the gate capping layer 126 in a first direction (X direction of FIG. 1) and/or in a third direction (Z direction of FIG. 2). Additionally, or alternatively, the gate capping layer 126 may extend in the second direction entirely or substantially entirely (e.g. 90-100%) from one extremity of the integrated circuit device 100 in the second direction (Y direction) to an opposing extremity of the integrated circuit device 100 in the second direction. In some embodiments, the gate capping layer 126 may include silicon nitride. The gate capping layer 126 may serve as a mask for forming a self-aligned contact.

A spacer structure 130 may be disposed on both side walls of the gate structure 120. For example, the spacer structure 130 may be disposed within (interior to) the gate structure 120 in the 1st direction (X direction) in FIG. 3. The spacer structure 130 may extend in an extension direction of the gate structure 120 on both side walls of the gate structure 120. For example, if the gate structure 120 may have the largest dimension in the second direction (Y direction of FIG. 1 and FIG. 2), the spacer structure may also have the largest dimension in the second direction. In some embodiments, the spacer structure 130 may include silicon oxide ($SiO_x$), silicon nitride ($SiN_x$), silicon oxynitride ($SiO_xN_y$), silicon carbonitride ($SiC_xN_y$), silicon oxycarbonitride ($SiO_xC_yN_z$), or a combination thereof.

In some embodiments, the spacer structure 130 may include multiple layers of different materials. For example, as illustrated in FIG. 3, the spacer structure 130 may include a first spacer layer 132 and a second spacer layer 134. The first spacer layer 132 may be formed on at least a portion of a side wall, or both side walls, of the gate structure 120. The first spacer layer 132 may be formed within the side walls of the gate structure 120 in the first direction (X direction) as shown in FIG. 2. The second spacer layer 134 may be surrounded by the first spacer layer 132. The second spacer layer 134 may thus be disposed on the first spacer layer 132. In some embodiments, the first spacer layer 132 may include silicon nitride, silicon oxide, or silicon oxynitride. The second spacer layer 134 may include an insulating material having a lower dielectric constant than a dielectric constant of the first spacer layer 132, and for example, the second spacer layer 134 may include an air space. For example, the second spacer layer 134 may refer to an empty space defined by a side wall of the first spacer layer 132, and the empty space may be filled with air. As the spacer structure 130 includes the second spacer layer 134 including an insulating material having a low dielectric constant, the parasitic capacitance of the integrated circuit device 100 due to the spacer structure 130 may be reduced.

A source/drain region 114 may be disposed in the fin-type active region FA disposed on both sides of the gate structure 120. The source/drain region 114 may include, but is not limited to, a doped SiGe film, a doped Ge film, a doped SiC film, or a doped InGaAs film. Some portions of the fin-type active region FA on both sides of the gate structure 120 are removed to form a recess region R1, and a semiconductor layer filling the inside of the recess region R1 is grown in an epitaxial process to form the source/drain region 114.

For example, when the fin-type active region FA is an active region for an NMOS transistor, the source/drain region 114 may include a doped SiC, and when the fin-type active region FA is an active region for a PMOS transistor, the source/drain region 114 may include a doped SiGe.

In addition, the source/drain region 114 may include multiple semiconductor layers having different compositions. For example, the source/drain region 114 may include a lower semiconductor layer (not shown), an upper semiconductor layer (not shown), and a capping semiconductor layer (not shown) that sequentially fill the recess region R1. The lower semiconductor layer, the upper semiconductor layer, and the capping semiconductor layer may each include SiGe but the amounts of Si and Ge included therein may be different.

A first contact structure 140 may be disposed on the source/drain region 114. In some embodiments, the first contact structure 140 may be a self-aligned contact, and at least a portion of a side wall of the first contact structure 140 may be aligned with a side wall of the spacer structure 130. For example, a side wall of the first contact structure 140 may contact a side wall of the first spacer layer 132.

The first contact structure 140 may include a first contact plug 142, a conductive barrier layer 144, and a first metallic capping layer 146.

In some embodiments, the first contact plug 142 may include at least one of cobalt (Co), nickel (Ni), ruthenium (Ru), copper (Cu), aluminum (Al), silicide thereof, and an alloy thereof. For example, the first contact plug 142 may include cobalt (Co). In some embodiments, the first contact plug 142 may not include tungsten (W).

The conductive barrier layer 144 may be disposed to surround a side wall of the first contact plug 142 in the first direction and second direction (X direction and Y direction in FIG. 3). The conductive barrier layer 144 may also be disposed between the first contact plug 142 and the spacer structure 130 in the first direction and second direction. The conductive barrier layer 144 may include Ti, Ta, TiN, TaN, or a combination thereof.

The first metallic capping layer 146 may be disposed on the first contact plug 142 and the conductive barrier layer 144 in the third direction (Z direction in FIG. 2). The first metallic capping layer 146 may cover substantially an entirety of an upper surface of the first contact plug 142 in a plane in the first direction and second directions (X direction and Y direction in FIG. 2). The first metallic capping layer 146 may include tungsten (W), tungsten nitride (WN), aluminum nitride (AlN), titanium (Ti), titanium nitride (TiN), titanium silicon nitride (TiSiN), tantalum (Ta), tantalum nitride (TaN), tantalum silicon nitride (TaSiN) or a combination thereof.

In some embodiments, the first metallic capping layer 146 may be formed on the first contact plug 142 and the conductive barrier layer 144 in the third direction (Z direction in FIG. 3) by a selective metal deposition process. Accordingly, as illustrated in FIG. 3, the first metallic capping layer 146 may cover substantially the entirety of an upper surface of the first contact plug 142 and the entirety of an upper surface of the conductive barrier layer 144 in a plane in the first direction and the second direction (X direction and Y direction) in FIG. 3. A side surface of the first metallic capping layer 146 may be aligned with, or meet, an outer side wall of the first contact plug 142 or an outer side wall of the conductive barrier layer 144.

As illustrated in FIG. 3, an upper surface of the first metallic capping layer 146 may be flush with an upper surface of the spacer structure 130. The first spacer layer 132 may surround a side surface of the first metallic capping layer 146 in a plane in the first direction and second direction (X direction and Y direction in FIG. 3). In addition, an upper surface level LV1 of the first contact plug 142 may be lower than an upper surface level LV2 of the spacer structure 130 in the third direction (Z direction in FIG. 3).

In some embodiments, the first metallic capping layer 146 may be formed on the first contact plug 142 and the conductive barrier layer 144. After removing a preliminary spacer 220 (see FIG. 13) on a side wall of the gate structure 120, the first spacer layer 132 may be formed to fill at least some portions of a space from which the preliminary spacer 220 is removed (e.g., an upper entrance of the space from which the preliminary spacer 220 is removed). The first spacer layer 132 may be formed using an insulating material that has poor step coverage characteristics. The spacer structure 130 including the air space may be formed by planarizing an upper portion of the first spacer layer 132. In the removal process of the preliminary spacer 220, the first metallic capping layer 146 may prevent oxidation or damage of the first contact plug 142. In the planarizing process, an upper surface of the first metallic capping layer 146 may be formed to be flush with an upper surface of the first spacer layer 132 in a plane in the first direction and second direction (X direction and Y direction).

As illustrated in FIG. 3, the first contact structure 140 may have a first width W1 in a first direction (X direction), and the conductive barrier layer 144 may have a first thickness T1 in the first direction (X direction). In some embodiments, the first thickness T1 of the conductive barrier layer 144 may be, but is not limited to, about 2% to 20% of the first width W1 of the first contact structure 140 in the first direction (X direction in FIG. 3). The first thickness T1 of the conductive barrier layer 144 may be relatively less than the first width W1 of the first contact structure 140, and thus the volume of the first contact plug 142 (or the cross-sectional area of the first contact plug 142) may be relatively large compared to the entirety of the first contact structure 140.

For example, when the first contact plug 142 includes a metal material such as cobalt (Co), a fluorine-containing source material used for forming a contact plug including tungsten (W) may not be used. When the fluorine-containing source material is used, it is generally required to form a conductive barrier layer having a large thickness in order to prevent the fluorine-containing source material or a reaction by-product thereof from damaging the spacer structure 130.

However, as described above, when the first contact plug 142 includes a metal material such as cobalt (Co), the fluorine-containing source material may not be used, the first thickness T1 of the conductive barrier layer 144 may be relatively less, and the volume of the first contact plug 142 (or the cross-sectional area of the first contact plug 142) may be relatively large compared to the first contact structure 140 overall. Thus, the first contact structure 140 may have a relatively low resistance.

A second contact structure 150 may be disposed on the gate structure 120. In some embodiments, at least a portion of a side wall of the second contact structure 150 may be aligned with a side wall of the spacer structure 130. A side wall of the second contact structure 150 may contact a side wall of the first spacer layer 132, but the second contact structure 150 is not limited thereto.

The second contact structure 150 may include a second contact plug 152, a conductive barrier layer 154, and a second metallic capping layer 156.

In some embodiments, descriptions of a material of each of the second contact plug 152, the conductive barrier layer 154, and the second metallic capping layer 156 may refer to (e.g., be the same as or similar to) the descriptions of the first contact plug 142, the conductive barrier layer 144, and the first metallic capping layer 146. In some embodiments, the second contact plug 152, the conductive barrier layer 154, and the second metallic capping layer 156 may be respectively formed by the same process of forming the first contact plug 142, the conductive barrier layer 144, and the first metallic capping layer 146.

Figure 10:
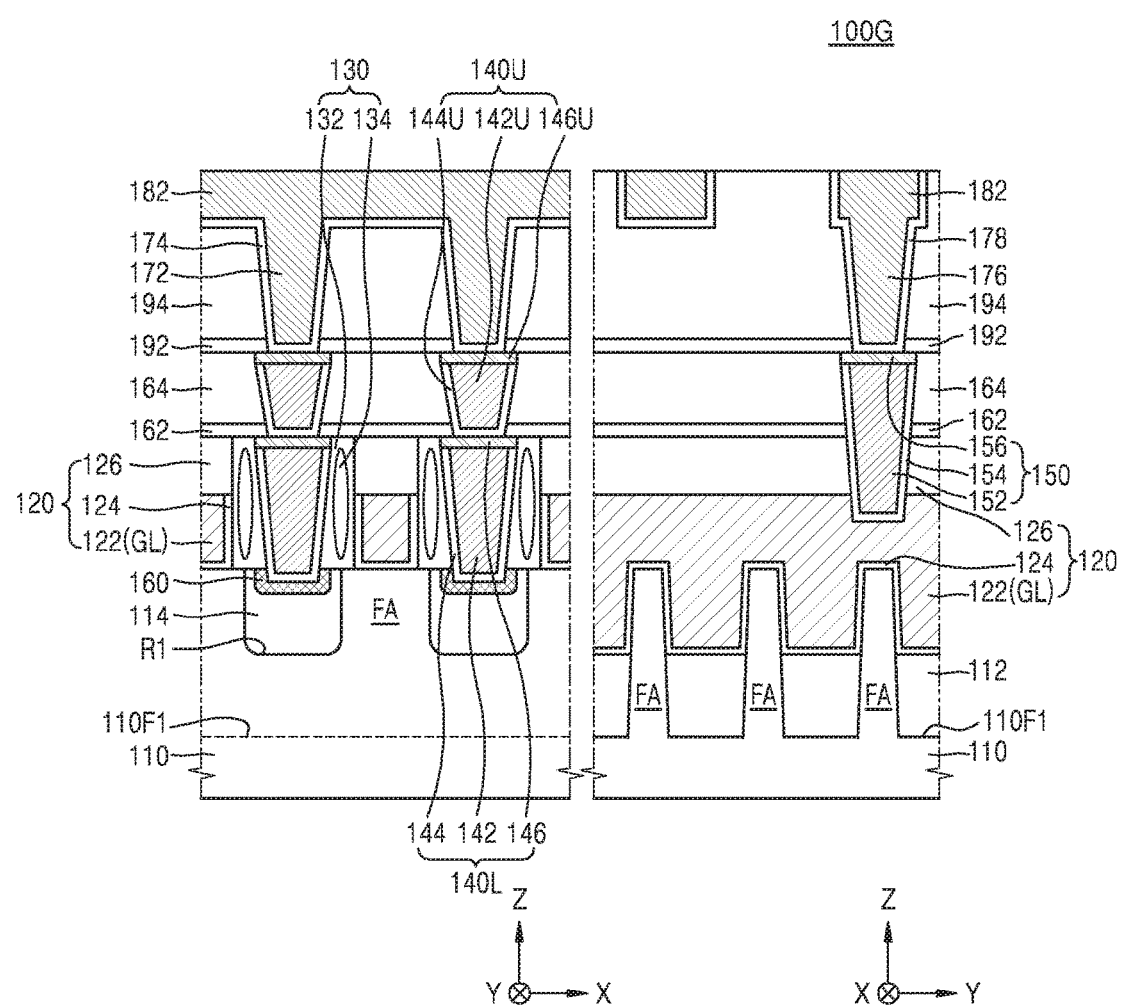
FIG. 10 illustrates a cross-sectional view showing an integrated circuit device according to exemplary embodiments.

In some embodiments, an upper surface of the second metallic capping layer 156 may be positioned in the same plane as an upper surface of the first metallic capping layer 146, such as in the plane that includes the first direction and second direction (X direction and Y direction) in FIG. 10.

Selectively, a silicide layer 160 may be formed between the source/drain region 114 and the first contact structure 140. The silicide layer 160 may include a metal silicide material.

An etch stop layer 162 may be formed on the gate structure 120, the spacer structure 130, and the first contact structure 140 and the second contact structure 150. A first insulating interlayer 164 may be formed on the etch stop layer 162. The etch stop layer 162 may include a material such as silicon nitride, silicon oxynitride, or aluminum oxide, which has an etch selectivity with respect to the first insulating interlayer 164. The first insulating interlayer 164 may include silicon oxide, a TEOS film, or an ultra low K (ULK) film having an ultra low dielectric constant of about 2.2 to 2.4. The ULK film may include a SiOC film or a SiCOH film.

A first via 172 may be connected to the first contact structure 140, and a side wall and a bottom surface of the first via 172 may be surrounded by the conductive barrier layer 174. The second via 176 may be connected to the second contact structure 150, and a side wall and a bottom surface of the second via 176 may be surrounded by a conductive barrier layer 178. A wiring layer 182 may be formed on the first via 172 and the second via 176. Side walls of the first via 172, the second via 176, and the wiring layer 182 may be surrounded by the first insulating interlayer 164. Although the first insulating interlayer 164 is configured as a single layer in the illustration of FIG. 2, the first insulating interlayer 164 may have a structure in which multiple insulating layers are stacked.

In the integrated circuit device 100 described above, the first contact structure 140 and the second contact structure 150 may respectively include the first metallic capping layer 146 and the second metallic capping layer 156 disposed respectively on upper surfaces of the first contact plug 142 and the second contact plug 152. The first metallic capping layer 146 and the second metallic capping layer 156 may prevent the first contact plug 142 and the second contact plug 152 from being oxidized or damaged in a removing process of a preliminary spacer in which an air spacer or a spacer of a low-k material are formed on a side wall of the gate structure 120. Furthermore, the first contact plug 142 and the second contact plug 152 may have a relatively low resistance. Thus, the first contact structure 140 and the second contact structure 150 may provide a reliable electrical connection while having a small size. In addition, when the spacer structure 130 includes the second spacer layer 134 including an air space, the integrated circuit device 100 may have reduced parasitic capacitance.

Figure 4:
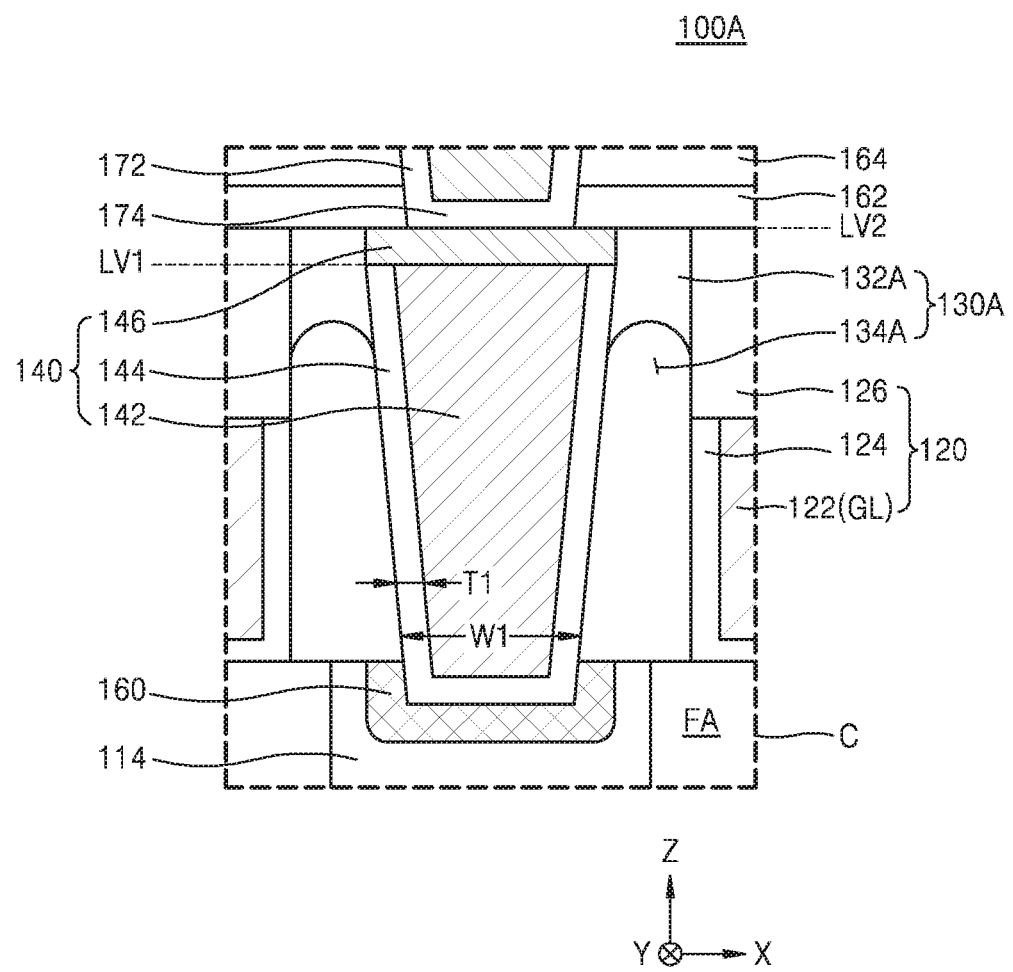
FIG. 4 illustrates a cross-sectional view showing an integrated circuit device according to exemplary embodiments.

FIG. 4 illustrates a cross-sectional view of an integrated circuit device 100A according to exemplary embodiments. FIG. 4 illustrates the cross-sectional view corresponding to the cross-sectional view of FIG. 3. The same reference numerals denote the same components in FIGS. 1 to 4.

Referring to FIG. 4, a spacer structure 130A may include a first spacer layer 132A surrounding an upper side wall of the first contact structure 140 and a second spacer layer 134A surrounding a lower side wall of the first contact structure 140 and including an air space. The second spacer layer 134A may include the air space defined by a lower side wall of the gate structure 120 and a lower side wall of the first contact structure 140.

In some embodiments, the first metallic capping layer 146 may be formed on the first contact plug 142 and the conductive barrier layer 144. After removing the preliminary spacer 220 (see FIG. 13) on a side wall of the gate structure 120, the first spacer layer 132A may be formed to cover an upper portion of a space from which the preliminary spacer 220 is removed. The first spacer layer 132A may be formed using an insulating material having poor step coverage characteristics. The spacer structure 130A including an air space may be formed by planarizing an upper portion of the first spacer layer 132A so that an upper surface of the first metallic capping layer 146 is exposed.

Figure 5:
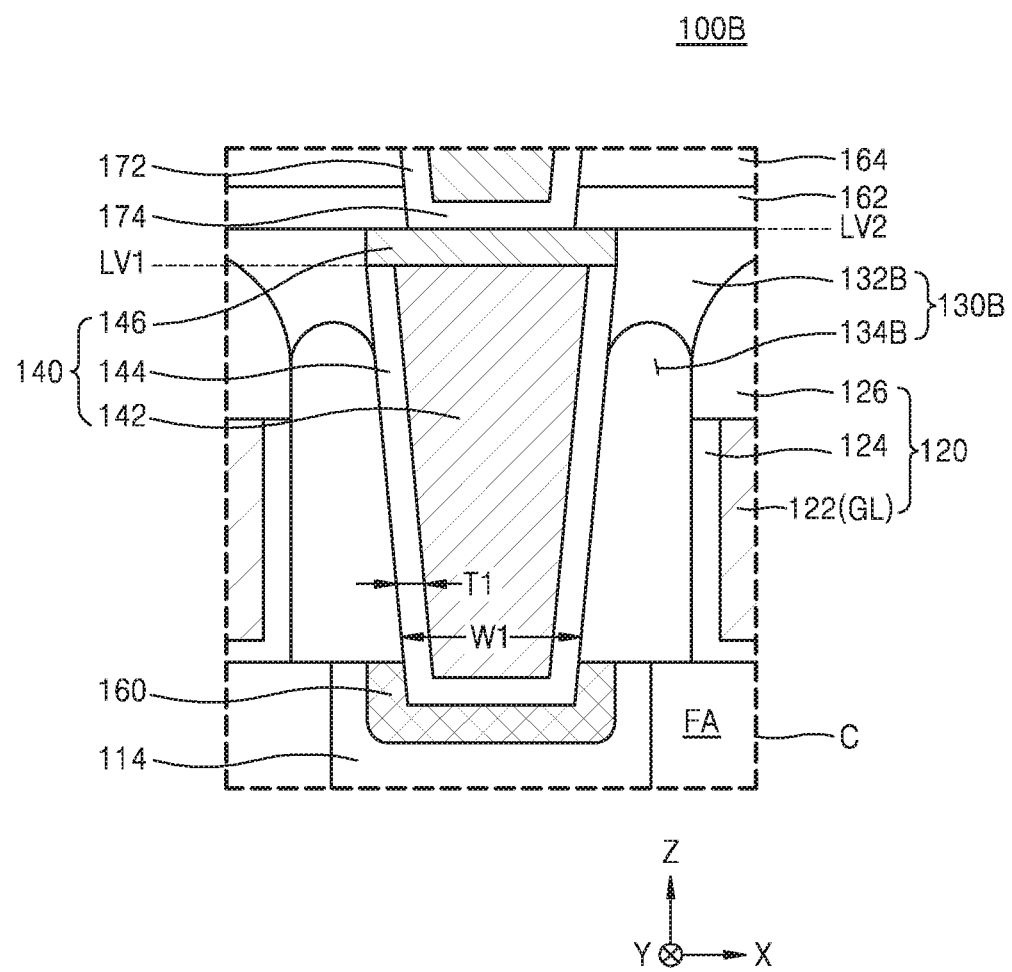
FIG. 5 illustrates a cross-sectional view showing an integrated circuit device according to exemplary embodiments.

FIG. 5 illustrates a cross-sectional view of an integrated circuit device 100B according to exemplary embodiments. The same reference numerals denote the same components in FIGS. 1 to 5.

Referring to FIG. 5, the gate structure 120 may include the gate capping layer 126 having a top profile that protrudes upward. The gate capping layer 126 may act as a self-aligned spacer. When a first contact hole CPH1 (see FIG. 12) is etched to form the first contact structure 140, an upper edge of the gate capping layer 126 is also removed by a predetermined thickness. Thus, the gate capping layer 126 may not have a flat upper surface.

A spacer structure 130B may include a second spacer layer 134B and a first spacer layer 132B. The second spacer layer 134B may include an air space surrounding a lower side wall of the first contact structure 140. The first spacer layer 132B may surround an upper side wall of the first contact structure 140. The first spacer layer 132B may fill a space between the gate capping layer 126 and an upper side wall of the first contact structure 140. The first spacer layer 132B may have a convex bottom surface profile conforming to a protruded upper surface profile of the gate capping layer 126.

Figure 6:
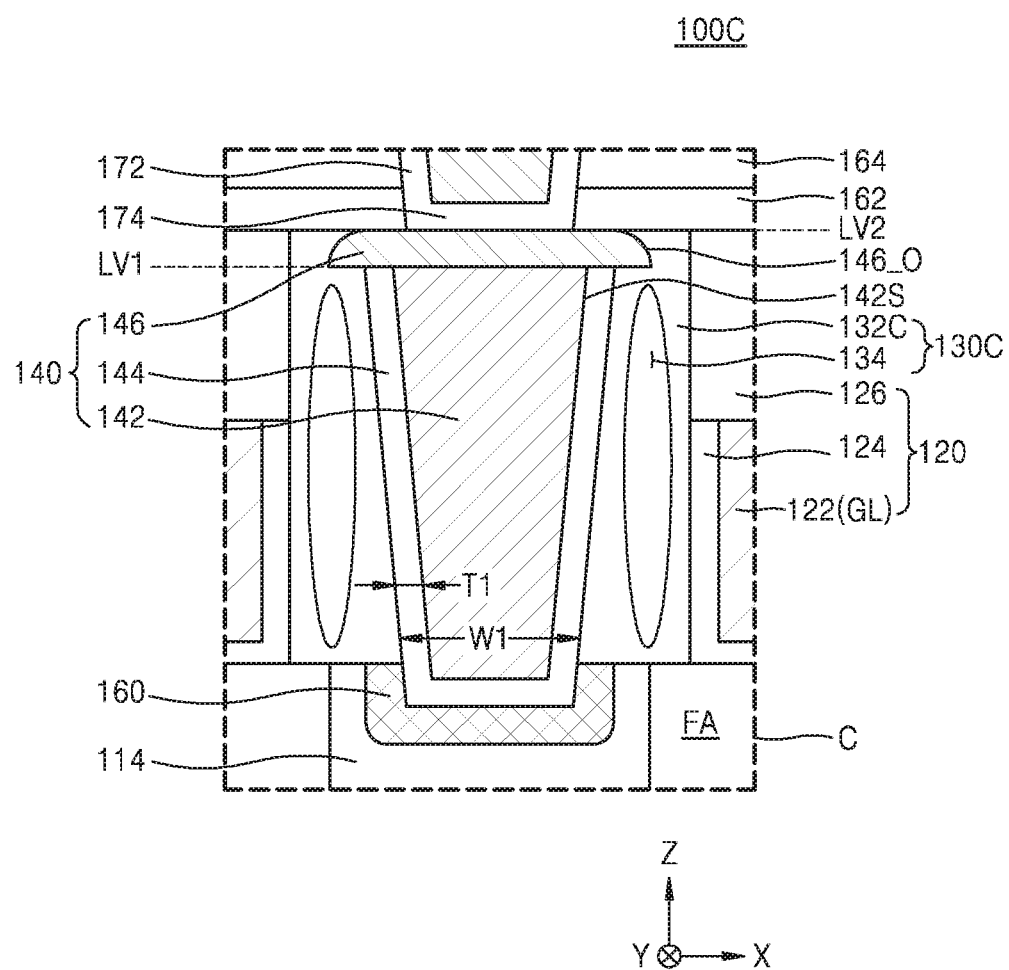
FIG. 6 illustrates a cross-sectional view showing an integrated circuit device according to exemplary embodiments.

FIG. 6 illustrates a cross-sectional view of an integrated circuit device 100C according to exemplary embodiments. The same reference numerals denote the same components in FIGS. 1 to 6.

Referring to FIG. 6, the first metallic capping layer 146 may include a protruding portion 146_O protruding laterally with respect to (beyond) a side wall 142S of the first contact plug 142 in the first direction/X direction. Also, the protruding portion 146_O may protrude laterally (in the first direction/X direction of FIG. 6) with respect to (beyond) a side wall of the conductive barrier layer 144. An edge portion of the protruding portion 146_O may have an upper surface profile that is upwardly convex. The size or shape of the protruding portion 146_O is schematically illustrated for the convenience of explanation. It may be understood that the size of shape of the protruding portion 146_O illustrated in FIG. 6 may be different from actual dimensions.

A spacer structure 130C may include a first spacer layer 132C disposed on, along, and/or adjacent to a side wall of the first contact structure 140, and the second spacer layer 134 including an air space on, along, adjacent to, and/or within the first spacer layer 132C. The first spacer layer 132C may surround the protruding portion 146_O. For example, as illustrated in FIG. 6, the first spacer layer 132C may be disposed on a side of the first contact plug 142 and vertically overlap the protruding portion 146_O of the first metallic capping layer 146. In other words, the first spacer layer 132C surrounds the protruding portion 146_O in the first direction (X direction in FIG. 6) at every level throughout the third direction (Z direction in FIG. 6) to vertically overlap the protruding portion 146_O on the page in the third direction.

In some embodiments, the first metallic capping layer 146 may be formed by a selective metal deposition process on the first contact plug 142 and the conductive barrier layer 144 in the third direction (Z direction in FIG. 6). In other words, exposed upper surfaces of the first contact plug 142 and the conductive barrier layer 144 may be used as a seed layer or a template to form the first metallic capping layer 146 having a predetermined thickness. Here, the first metallic capping layer 146 may also grow laterally on the first contact plug 142 and the conductive barrier layer 144 by a predetermined width. Thus, the first metallic capping layer 146 may protrude laterally with respect to (beyond) the side wall 142S of the first contact plug 142 in the first direction/X direction. Then, after removing the preliminary spacer 220 (see FIG. 13) on a side wall of the gate structure 120, the first spacer layer 132C may be formed to fill some portions of a space from which the preliminary spacer 220 is removed. The first spacer layer 132C may be formed using an insulating material having poor step coverage characteristics. The spacer structure 130C including an air space may be formed by planarizing an upper portion of the first spacer layer 132C so that an upper surface of the first metallic capping layer 146 is exposed. Thus, the first spacer layer 132C may be formed to surround the protruding portion 146_O.

Figure 7:
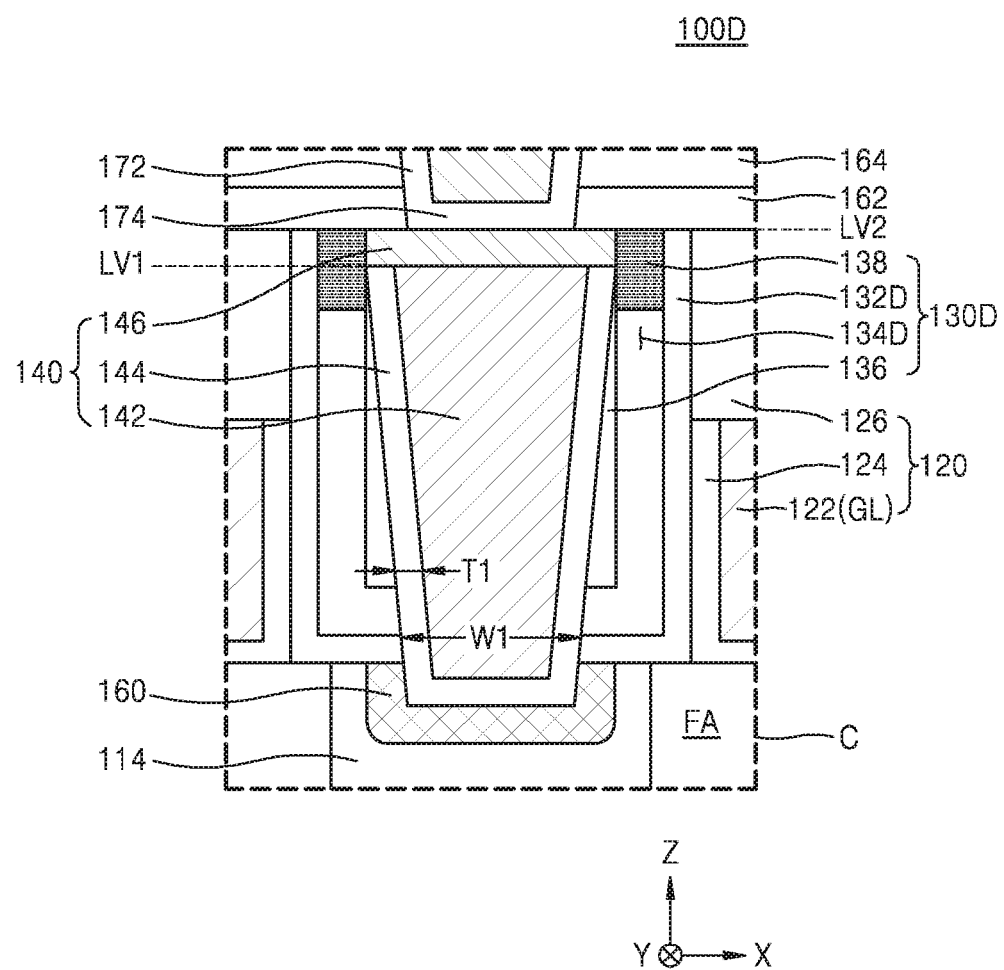
FIG. 7 illustrates a cross-sectional view showing an integrated circuit device according to exemplary embodiments.

FIG. 7 illustrates a cross-sectional view of an integrated circuit device 100D according to exemplary embodiments. The same reference numerals denote the same components in FIGS. 1 to 7.

Referring to FIG. 7, a spacer structure 130D may include a first spacer layer 132D, a second spacer layer 134D, a third spacer layer 136, and a fourth spacer layer 138. The first spacer layer 132D may be conformally disposed on a side wall of the gate structure 120 and may extend along the side wall of the gate structure 120 in the third direction (Z direction of FIG. 7). Some portions of the first spacer layer 132D may extend in the first direction (X direction of FIG. 7) on an upper surface of the source/drain region 114 of both sides of the gate structure 120. The third spacer layer 136 may contact a side wall of the first contact structure 140. The second spacer layer 134D may include an air space defined by the first spacer layer 132D, the third spacer layer 136, and some portions of a side wall of the first contact structure 140. The fourth spacer layer 138 may be formed between the first spacer layer 132D and the third spacer layer 136 and cover an upper portion of the second spacer layer 134D. An upper surface of the fourth spacer layer 138 may be flush with an upper surface of the first metallic capping layer 146.

In some embodiments, a preliminary spacer 220A (see FIG. 18) including the first spacer layer 132D, a second preliminary spacer layer 224, and the third spacer layer 136 may be formed on a side wall of the gate structure 120, and then the first contact structure 140 may be formed and only the second preliminary spacer layer 224 of the preliminary spacer 220A may be selectively removed. Next, the fourth spacer layer 138 covering an upper portion of a space from which the second preliminary spacer layer 224 is removed may be formed using an insulating material having poor step coverage characteristics, and the spacer structure 130D including an air space may be formed by planarizing an upper portion of the fourth spacer layer 138 so that an upper surface of the first metallic capping layer 146 is exposed.

Figure 8:
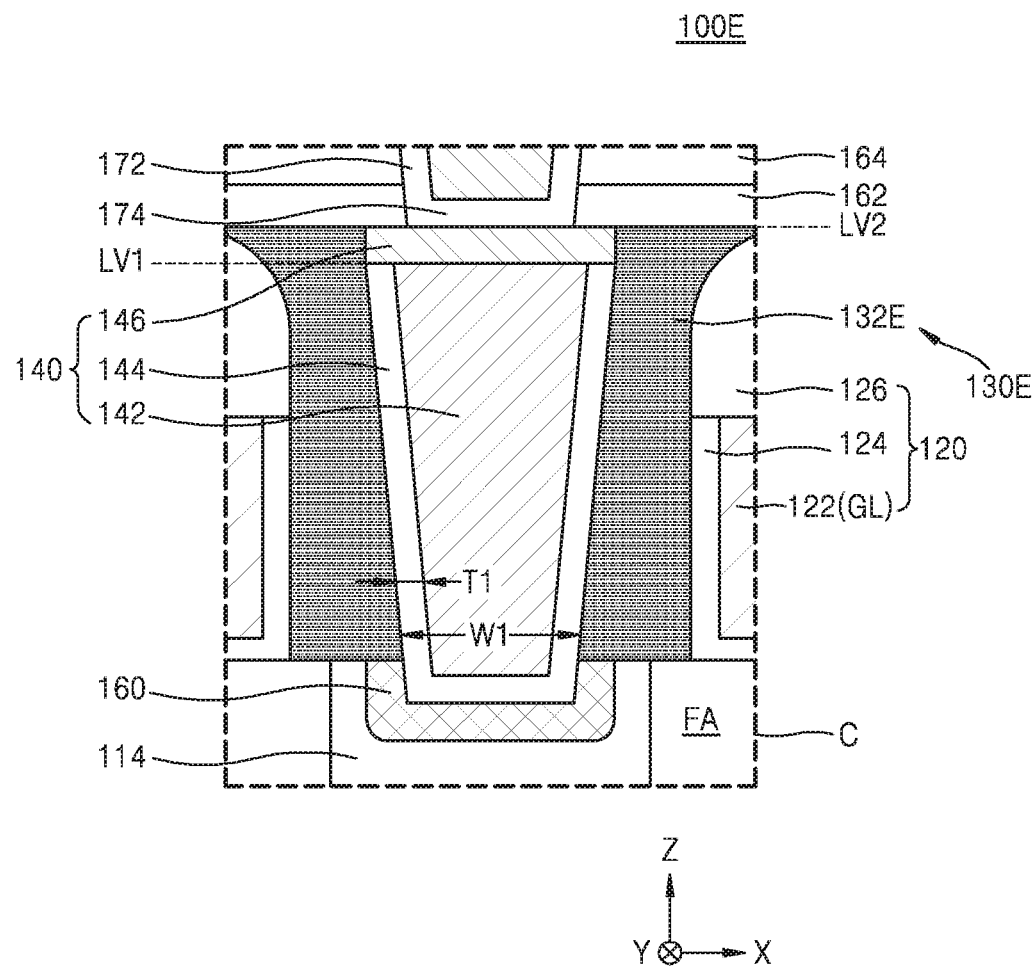
FIG. 8 illustrates a cross-sectional view showing an integrated circuit device according to exemplary embodiments.

FIG. 8 illustrates a cross-sectional view of an integrated circuit device 100E according to exemplary embodiments. The same reference numerals denote the same components in FIGS. 1 to 8.

Referring to FIG. 8, a spacer structure 130E may include a first spacer layer 132E that is single. The gate structure 120 may include the gate capping layer 126 having an upper surface profile that protrudes upwardly, and the first spacer layer 132E may completely fill a space between the gate structure 120 and the first contact structure 140.

In some embodiments, the first spacer layer 132E may include a low-k material. For example, the low-k material may be an insulating material having a dielectric constant less than 3.9. In some embodiments, the first spacer layer 132E may include $SiO_xC_yN_z$, $SiC_xO_yH_z$, or $SiC_xN_y$.

In some embodiments, the first metallic capping layer 146 may be formed on the first contact plug 142 and the conductive barrier layer 144. After removing the preliminary spacer 220 (see FIG. 13) on a side wall of the gate structure 120, the first spacer layer 132E may be formed to fill the inside of a space from which the preliminary spacer 220 is removed. The first spacer layer 132E is formed using an insulating material having excellent gap fill characteristics. The spacer structure 130E including a low-k material may be formed by planarizing an upper portion of the first spacer layer 132E so that an upper surface of the first metallic capping layer 146 is exposed.

Figure 9:
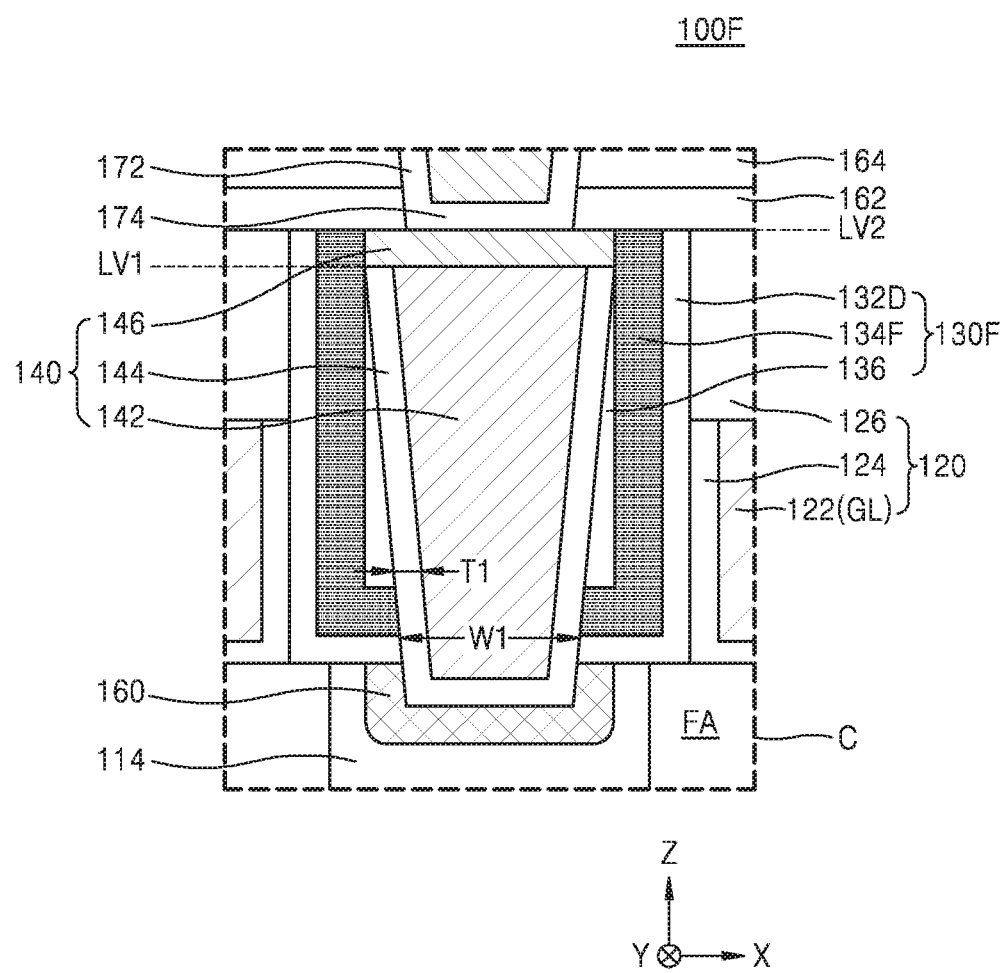
FIG. 9 illustrates a cross-sectional view showing an integrated circuit device according to exemplary embodiments.

FIG. 9 illustrates a cross-sectional view of an integrated circuit device 100F according to exemplary embodiments. The same reference numerals denote the same components in FIGS. 1 to 9.

Referring to FIG. 9, a spacer structure 130F may include the first spacer layer 132D, a second spacer layer 134F, and the third spacer layer 136. The first spacer layer 132D may be conformally disposed on a side wall of the gate structure 120 and extend along the side wall of the gate structure 120 in a vertical direction (the third direction/Z direction of FIG. 9). Some portions of the first spacer layer 132D may extend in a horizontal direction (the first direction/X direction) on an upper surface of the source/drain region 114 on both sides of the gate structure 120. The third spacer layer 136 may contact a side wall of the first contact structure 140. The second spacer layer 134F may be disposed between the first spacer layer 132D and the third spacer layer 136 and contact some portions of a side wall of the first contact structure 140. The second spacer layer 134F may include a low-k material, and a description of the low-k material may refer to that of FIG. 8. An upper surface of the second spacer layer 134F may be flush with an upper surface of the first metallic capping layer 146.

In some embodiments, the preliminary spacer 220A (see FIG. 18) including the first spacer layer 132D, the second preliminary spacer layer 224, and the third spacer layer 136 is formed on a side wall of the gate structure 120. Then, the first contact structure 140 may be formed and only the second preliminary spacer layer 224 of the preliminary spacer 220A may be selectively removed. Next, the second spacer layer 134F may be formed to fill the inside of a space from which the second preliminary spacer layer 224 is removed. The second spacer layer 134F may be formed using a low-k insulating material having excellent gap fill characteristics. The spacer structure 130F may be formed by planarizing an upper portion of the second spacer layer 134F so that an upper surface of the first metallic capping layer 146 is exposed.

FIG. 10 illustrates a cross-sectional view of an integrated circuit device 100G according to exemplary embodiments. The same reference numerals denote the same components in FIGS. 1 to 10.

Referring to FIG. 10, the integrated circuit device 100G may include a first lower contact structure 140L connected to the source/drain region 114 and a first upper contact structure 140U formed on the first lower contact structure 140L. The first lower contact structure 140L may be similar to the first contact structure 140 described with reference to FIGS. 1 to 3. The first upper contact structure 140U may include a first upper contact plug 142U, a conductive barrier layer 144U, and a first upper metallic capping layer 146U. The first upper contact structure 140U may be surrounded by the first insulating interlayer 164, and a second etch stop layer 192 and a second insulating interlayer 194 may be formed on the first insulating interlayer 164 and the first upper contact structure 140U.

The second contact structure 150 may be electrically connected to the gate structure 120 and have an upper surface at the same level as an upper surface of the first upper contact structure 140U. The upper surface of the second contact structure 150 may be at a higher level than an upper surface of the first lower contact structure 140L.

In some embodiments, the first lower contact structure 140L may be formed on the source/drain region 114. The etch stop layer 162 and the first insulating interlayer 164 covering the first lower contact structure 140L may be formed, and a first upper contact hole CPH1U (see FIG. 25) and a second contact hole CPH2A (see FIG. 25) may be formed to form the first upper contact structure 140U and the second contact structure 150. Then, the first upper contact structure 140U and the second contact structure 150 may be respectively formed on inner walls of the first upper contact hole CPH1U and the second contact hole CPH2A. The first upper contact structure 140U and the second contact structure 150 may be formed in the same process. Thus, an upper surface of the second metallic capping layer 156 may be in the same plane as an upper surface of the first upper metallic capping layer 146U. The upper surface of the second metallic capping layer 156 may be at a higher level than an upper surface of the first metallic capping layer 146.

The first upper metallic capping layer 146U and the second metallic capping layer 156 may act as a protection layer that prevents the first upper contact plug 142U and the second contact plug 152 from being oxidized or damaged in the subsequent etch process for forming the first via 172 and the second via 176.

FIGS. 11 to 17 illustrate cross-sectional views showing a method of manufacturing the integrated circuit device 100 according to exemplary embodiments.

FIGS. 11 to 17 illustrate cross-sectional views taken along lines A-A' and B-B' of FIG. 1 in an order of the process. The same reference numerals denote the same components in FIGS. 10 to 17.

Figure 11:
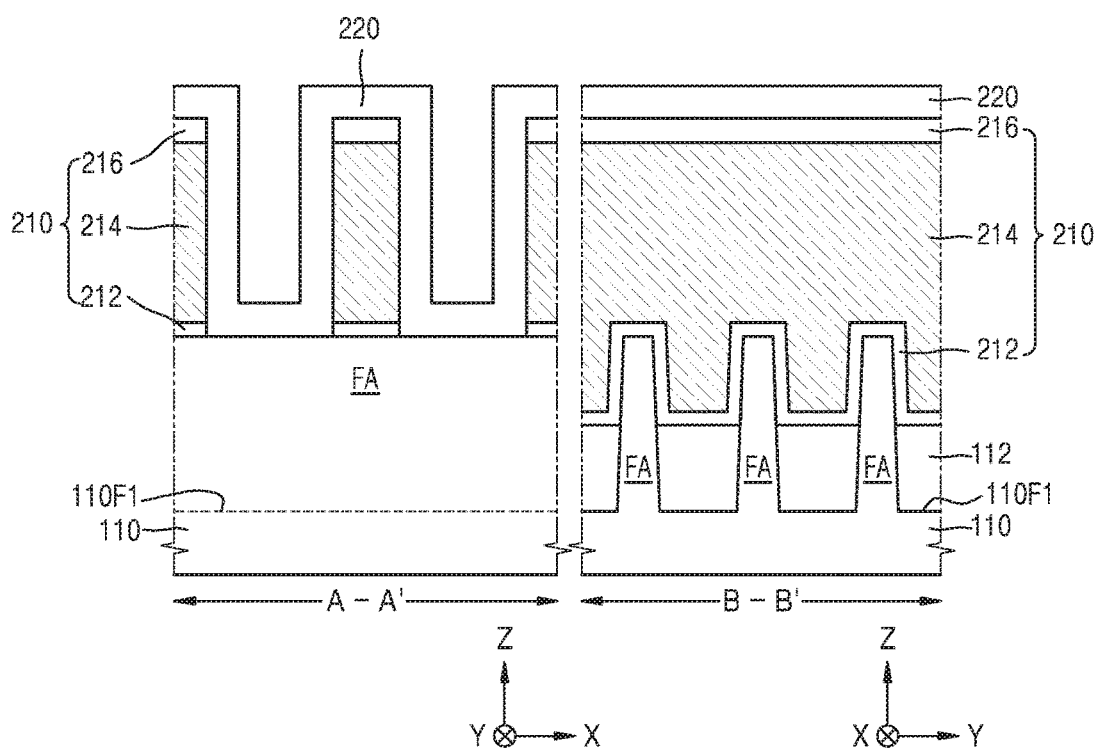
FIGS. 11 to 17 illustrate cross-sectional views showing a method of manufacturing an integrated circuit device, according to exemplary embodiments.

Referring to FIG. 11, some portions of an active region of the substrate 110 are etched to form the fin-type active region FA vertically in FIG. 11 (in the third direction/Z direction) protruding from the upper surface 110F1 of the substrate 110 and extending in the first direction (X direction of FIG. 11) into the page in FIG. 11. For example, a dimension of the fin-type active region FA in the first direction may be larger than dimensions of the fin-type active region FA in a second direction (Y direction of FIG. 11) and/or in a third direction (Z direction of FIG. 11). Additionally, or alternatively, the fin-type active region FA may extend in the first direction entirely or substantially entirely (e.g. 90-100%) from one extremity of the integrated circuit device 100 in the first direction to an opposing extremity of the integrated circuit device 100 in the first direction.

The isolation layer 112 covering both side walls of the fin-type active region FA may be formed on the substrate 110. Although not illustrated, an interfacial layer (not shown) conformally covering a side wall of the fin-type active region FA may be further formed between the isolation layer 112 and the fin-type active region FA.

Then, a sacrificial gate insulating layer (not shown), a sacrificial gate conductive layer (not shown), and a hard mask pattern 216 are sequentially formed on the substrate 110. The sacrificial gate conductive layer and the sacrificial gate insulating layer are patterned using the hard mask pattern 216 as an etch mask to form a sacrificial gate 214 and a sacrificial gate insulating layer pattern 212. Here, the sacrificial gate insulating layer pattern 212, the sacrificial gate 214, and the hard mask pattern 216 are referred to as a sacrificial gate structure 210. The sacrificial gate structure 210 has two sides and two side walls.

Then, the preliminary spacer 220 covering the sacrificial gate structure 210 may be formed using an atomic layer deposition (ALD) process or a chemical vapor deposition (CVD) process. For example, the preliminary spacer 220 may include silicon nitride, but the preliminary spacer 220 is not limited thereto.

Figure 12:
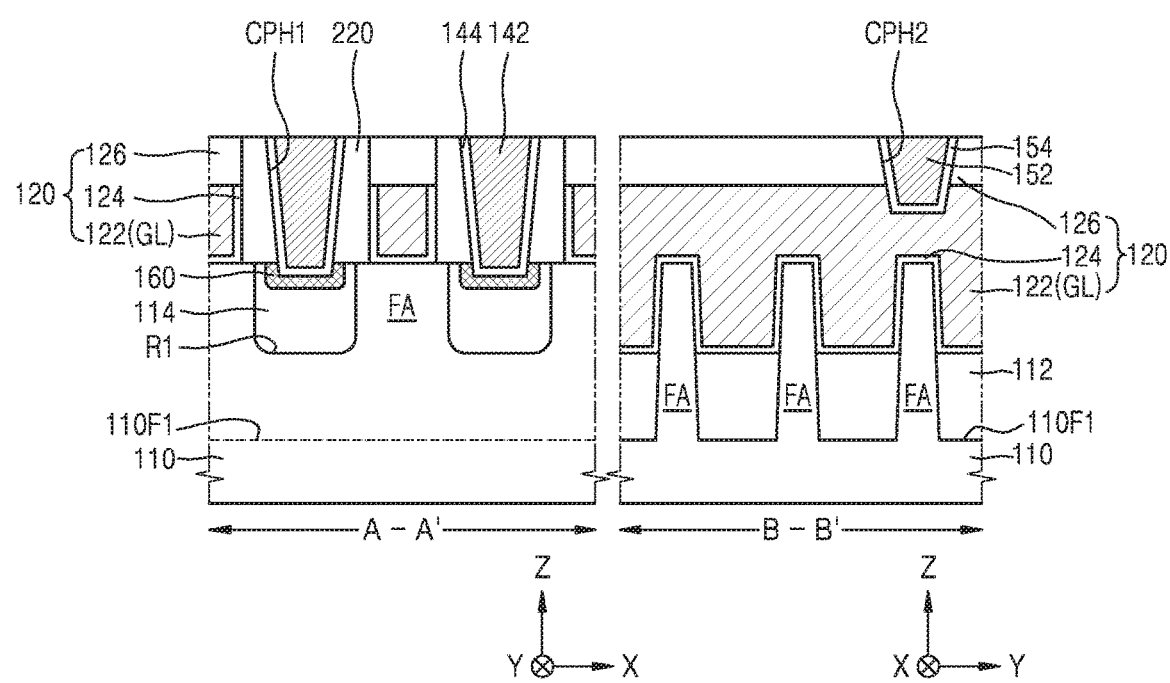

Referring to FIG. 12, an anisotropic etch process may be performed on the preliminary spacer 220 to leave the preliminary spacer 220 only on a side wall of the sacrificial gate structure 210.

Next, some portions of the fin-type active region FA in both sides of the preliminary spacer 220 may be etched to form the recess region R1, and the source/drain region 114 may be formed in an inner portion of the recess region R1.

In some embodiments, the source/drain region 114 may be formed by an epitaxial process while using a side wall of the fin-type active region FA and an upper surface of the substrate 110 that are exposed in an inner wall of the recess region R1 as a seed layer. The epitaxial process may be a CVD process such as vapor-phase epitaxy (VPE) or ultra-high vacuum chemical vapor deposition (UHV-CVD), molecular beam epitaxy, or a combination thereof. In the epitaxial process, a liquid or gaseous precursor may be used as a precursor required for forming the source/drain region 114.

The source/drain region 114 may be formed to have various shapes by controlling growth conditions in the epitaxial process. For example, the source/drain region 114 may have a polygonal shape formed by connecting inclined planes having a predetermined angle. However, the shape of the source/drain region 114 is not limited thereto and may have various shapes depending on a material of the fin-type active region FA, a material of the source/drain region 114, the type of a transistor formed on the substrate 110, and conditions of the epitaxial process.

Then, an insulating layer (not shown) covering the preliminary spacer 220 and the hard mask pattern 216 (see FIG. 11) may be formed on the substrate 110. An intergate insulating layer (not shown) may be formed by planarizing the insulating layer so that an upper surface of the hard mask pattern 216 is exposed.

Then, the sacrificial gate structure 210 (see FIG. 11) may be removed to form a gate space (not shown) defined between side walls of the preliminary spacer 220, and the gate insulating layer 124 may be formed on an inner wall of the gate space. Next, a conductive layer (not shown) filling the gate space may be formed on the gate insulating layer 124. Then, the gate electrode 122 may be formed by etching back an upper portion of the conductive layer. Next, an insulating layer (not shown) filling a remaining portion of the gate space may be formed on the gate electrode 122 and the intergate insulating layer. Then, the gate capping layer 126 filling the gate space may be formed by removing an upper portion of the insulating layer so that an upper surface of the intergate insulating layer or the preliminary spacer 220 is exposed.

In some embodiments, the removal process of the sacrificial gate structure 210 may include a wet etching process. In order to perform the wet etching process, an etchant including, for example, $HNO_3$, diluted fluoric acid (DHF), $NH_4OH$, tetramethyl ammonium hydroxide (TMAH), KOH, or a combination thereof may be used.

Then, the gate capping layer 126 and the preliminary spacer 220 may be used as a self-aligned etch mask to etch the intergate insulating layer to form the first contact hole CPH1 exposing an upper surface of the source/drain region 114.

Then, a mask pattern (not shown) exposing some portions of an upper surface of the gate structure 120 may be formed, and a second contact hole CPH2 exposing an upper surface of the gate electrode 122 may be formed using the mask pattern as an etch mask.

The conductive barrier layers 144 and 154 may be respectively formed on inner walls of the first contact hole CPH1 and the second contact hole CPH2 using Ti, Ta, TiN, TaN, or a combination thereof.

Then, the first contact plug 142 and the second contact plug 152 respectively filling the first contact hole CPH1 and the second contact hole CPH2 may be respectively formed on the conductive barrier layers 144 and 154. The first contact plug 142 and the second contact plug 152 may be formed using cobalt (Co), nickel (Ni), ruthenium (Ru), copper (Cu), aluminum (Al), silicide thereof, or an alloy thereof.

In some embodiments, the first contact plug 142 and the second contact plug 152 may not include tungsten, and in this case, a fluorine-containing source material may not be used in a formation process of the first contact plug 142 and the second contact plug 152. Thus, a conductive barrier layer may not be formed to have a large thickness to prevent the fluorine-containing source material or a reaction by-products thereof from damaging the spacer structure 130 (see FIG. 3) or the intergate insulating layer. As a result, the conductive barrier layers 144 and 154 having a relatively small first thickness T1 (see FIG. 3) may be formed, and the first contact plug 142 and the second contact plug 152 may have relatively low resistance.

Figure 13:
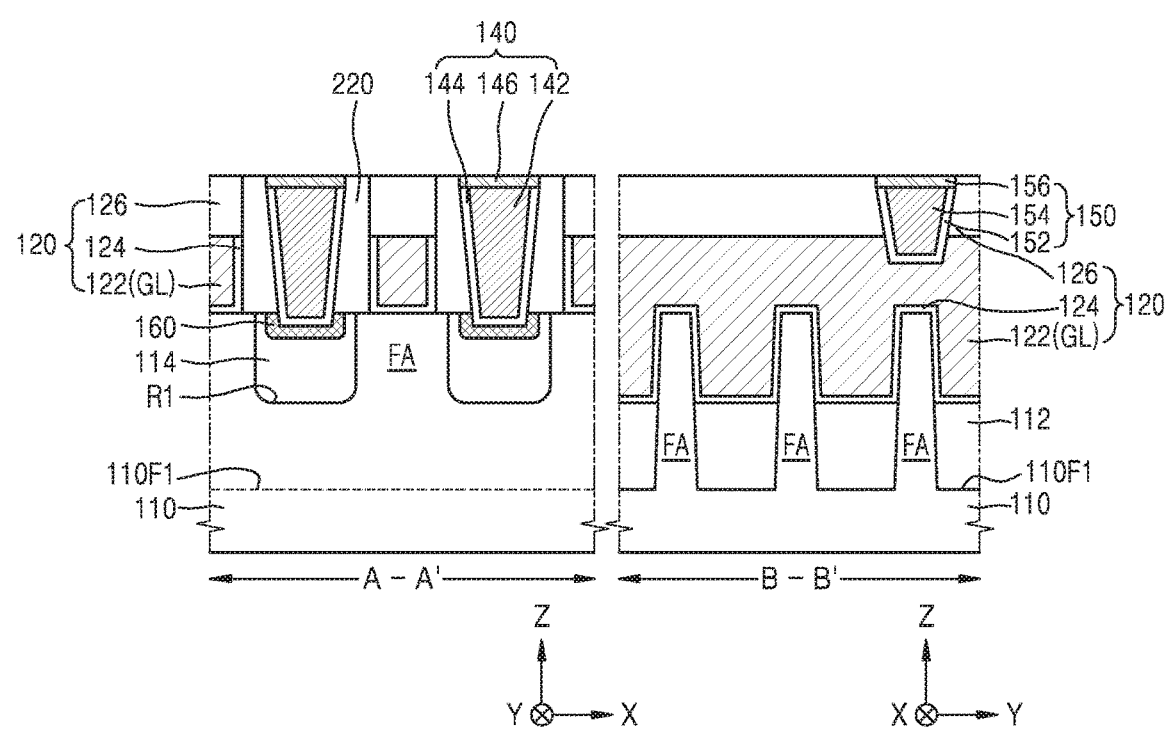

Referring to FIG. 13, the first metallic capping layer 146 may be formed on the first contact plug 142 and the conductive barrier layer 144 by a selective metal deposition process. The second metallic capping layer 156 may be formed on the second contact plug 152 and the conductive barrier layer 154.

The selective metal deposition process may be performed, for example, in a manner in which a metal film is selectively formed on a metallic surface for the exposed preliminary spacer 220 and intergate insulating layer (not shown). In some embodiments, the selective metal deposition process may be performed at a temperature of about 280° C. to about 350° C. In some embodiments, the selective metal deposition process may be performed at a flow rate of $SiH_4/WF_6$ of about 0.6 or less using hydrogen as the carrier gas. In some embodiments, before the selective metal deposition process is performed, a pretreatment process such as an in-situ plasma treatment using $NH_3$ or $H_2$ plasma may be further performed. However, the selective metal deposition process is not limited thereto.

In some embodiments, the first metallic capping layer 146 and the second metallic capping layer 156 may be formed using tungsten (W), tungsten nitride (WN), aluminum nitride (AlN), titanium (Ti), titanium nitride (TiN), titanium silicon nitride (TiSiN), tantalum (Ta), tantalum nitride (TaN), and tantalum silicon nitride (TaSiN).

Figure 14:
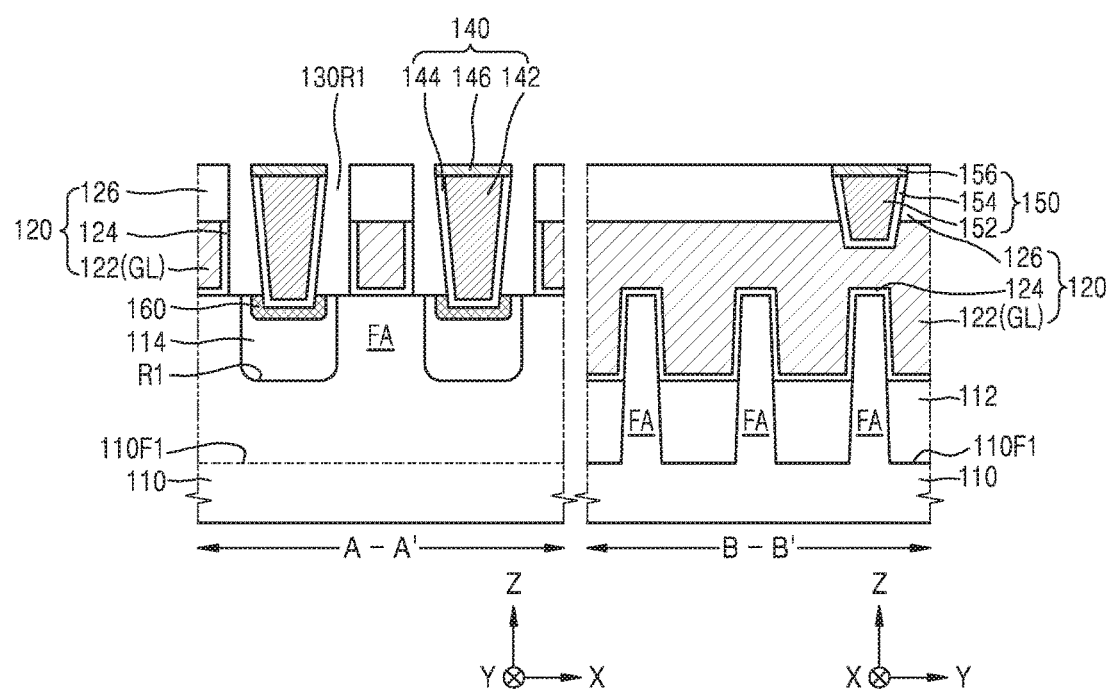

Referring to FIG. 14, the preliminary spacer 220 (see FIG. 13) is removed, and then the recess region 130R1 may be formed in a space between the first contact structure 140 and the second contact structure 150 and the gate structure 120. The removal process for forming the recess region 130R1 may include an isotropic wet etching process, an isotropic dry etching process, and an anisotropic etching process. The first contact plug 142 and the second contact plug 152 may be covered by the first metallic capping layer 146 and the second metallic capping layer 156 and may not be exposed to the outside, and in the removal process, the oxidation or damage of the first contact plug 142 and the second contact plug 152 may be prevented.

Figure 15:
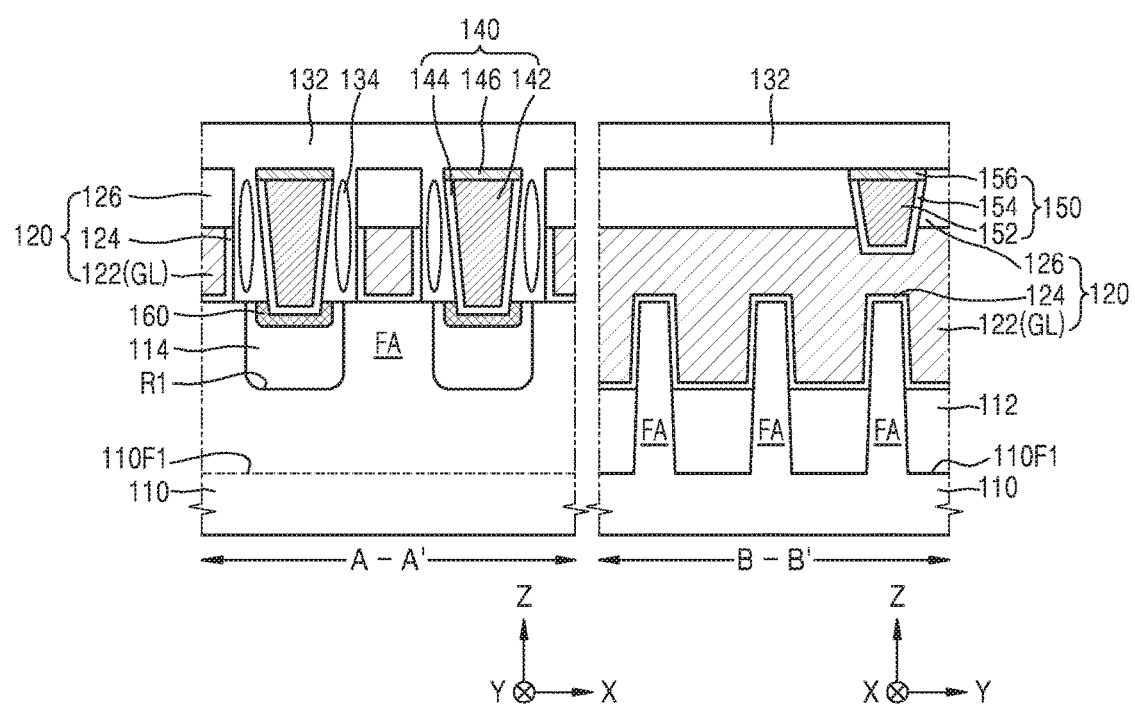

Referring to FIG. 15, the first spacer layer 132 covering an upper portion of the recess region 130R1 (see FIG. 14) may be formed on the first contact structure 140 and the second contact structure 150 and the gate structure 120 using an insulating material.

In some embodiments, the first spacer layer 132 may be formed using an insulating material having poor step coverage by a plasma enhanced CVD process. For example, the first spacer layer 132 may include, but is not limited to, silicon nitride.

The first spacer layer 132 may not completely fill the recess region 130R1 and an air space may remain inside the recess region 130R1. Here, the air space may be referred to as the second spacer layer 134.

Figure 16:
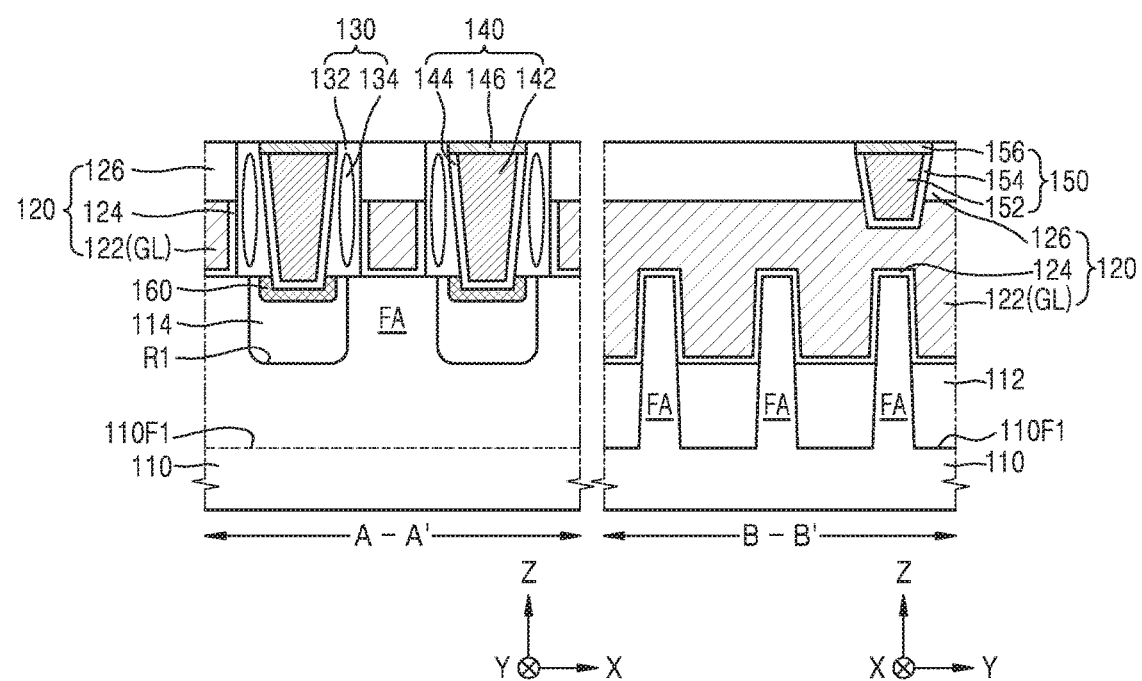

Referring to FIG. 16, an upper portion of the first spacer layer 132 may be planarized until upper surfaces of the first metallic capping layer 146 and the second metallic capping layer 156 are exposed. In this regard, the spacer structure 130 including the first spacer layer 132 and the second spacer layer 134 including an air space may be formed.

Figure 17:
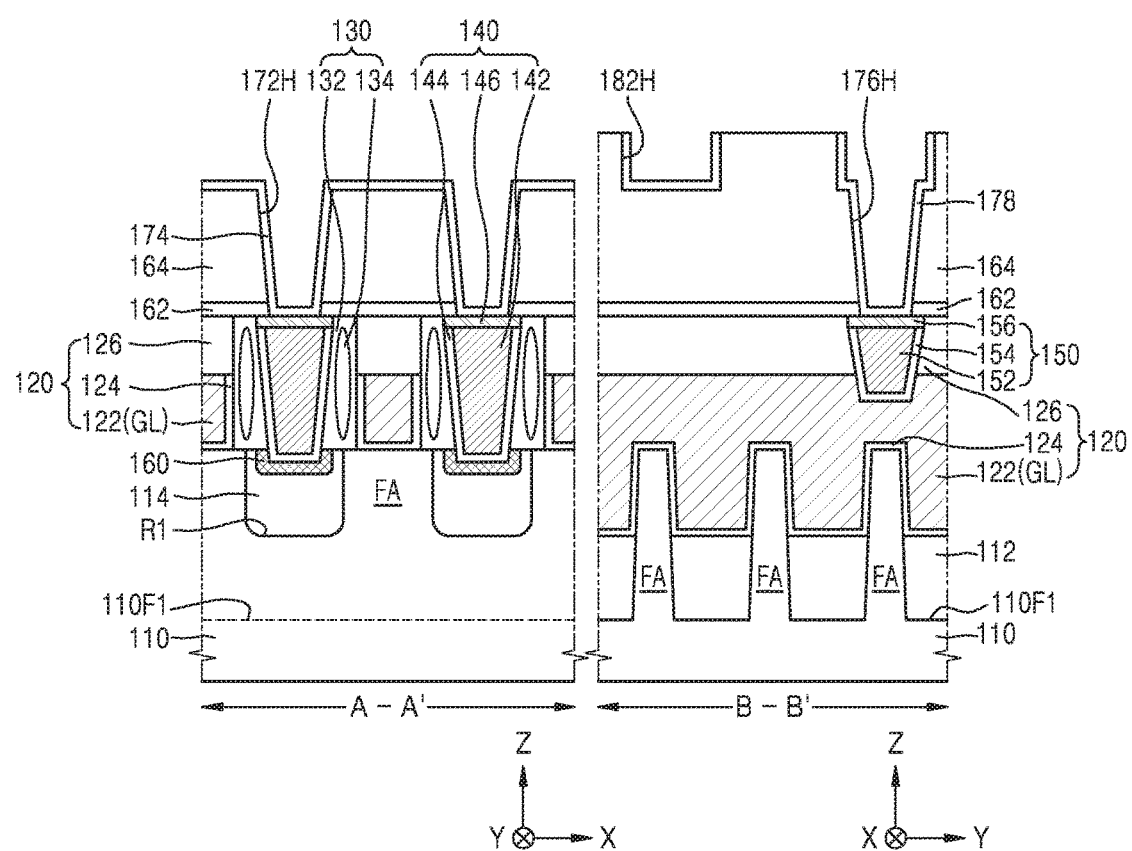

Referring to FIG. 17, the etch stop layer 162 and the first insulating interlayer 164 may be sequentially formed on the gate structure 120, the spacer structure 130, and the first metallic capping layer 146 and the second metallic capping layer 156. Then, a first via hole 172H exposing an upper surface of the first metallic capping layer 146 and a second via hole 176H exposing an upper surface of the second metallic capping layer 156 may be formed. Here, an upper opening 182H communicated with the first via hole 172H or the second via hole 176H may be formed.

Then, a conductive layer (not shown) may be formed on the first insulating interlayer 164. Thus, the conductive barrier layer 174 may be formed on an inner wall of the first via hole 172H, and the conductive barrier layer 178 may be formed on an inner wall of the second via hole 176H.

Referring to FIGS. 2 and 17, a conductive layer (not shown) may be formed inside the first via hole 172H, the first via 172, the second via 176, and the wiring layer 182 respectively filling the first via hole 172H, the second via hole 176H and the upper opening 182H may be formed by planarizing the conductive layer until upper surfaces of second via hole 176H and the upper opening 182H, and the first insulating interlayer 164 are exposed.

According to the aforementioned method of manufacturing the integrated circuit device 100, In the formation process of the spacer structure 130 including an air space, (e.g., the removal process of the preliminary spacer 220) the first metallic capping layer 146 and the second metallic capping layer 156 may act as a protection layer for preventing the first contact plug 142 and the second contact plug 152 from being oxidized or damaged. Thus, the integrated circuit device 100 manufactured according to the aforementioned method may provide a reliable electrical connection.

In some other embodiments, the first spacer layer 132A may barely fill a bottom portion of the recess region 130R1 and may only be formed on super side walls of the first contact structure 140 and the second contact structure 150 and the gate structure 120. In this case, the integrated circuit device 100A including the spacer structure 130A described with reference to FIG. 4 may be formed.

In some other embodiments, in the removal process for forming the first contact hole CPH1, an upper portion of the gate capping layer 126 may be further consumed by a predetermined thickness to lower the height of the gate capping layer 126. A portion of the gate capping layer 126 disposed between two adjacent first contact holes CPH1 may be formed to have an upper surface protruded upward or a rounded upper surface. In this case, the integrated circuit device 100B including the spacer structure 130B described with reference to FIG. 5 may be formed.

FIGS. 18 to 21 illustrate cross-sectional views showing a method of manufacturing an integrated circuit device 100D according to exemplary embodiments.

Figure 18:
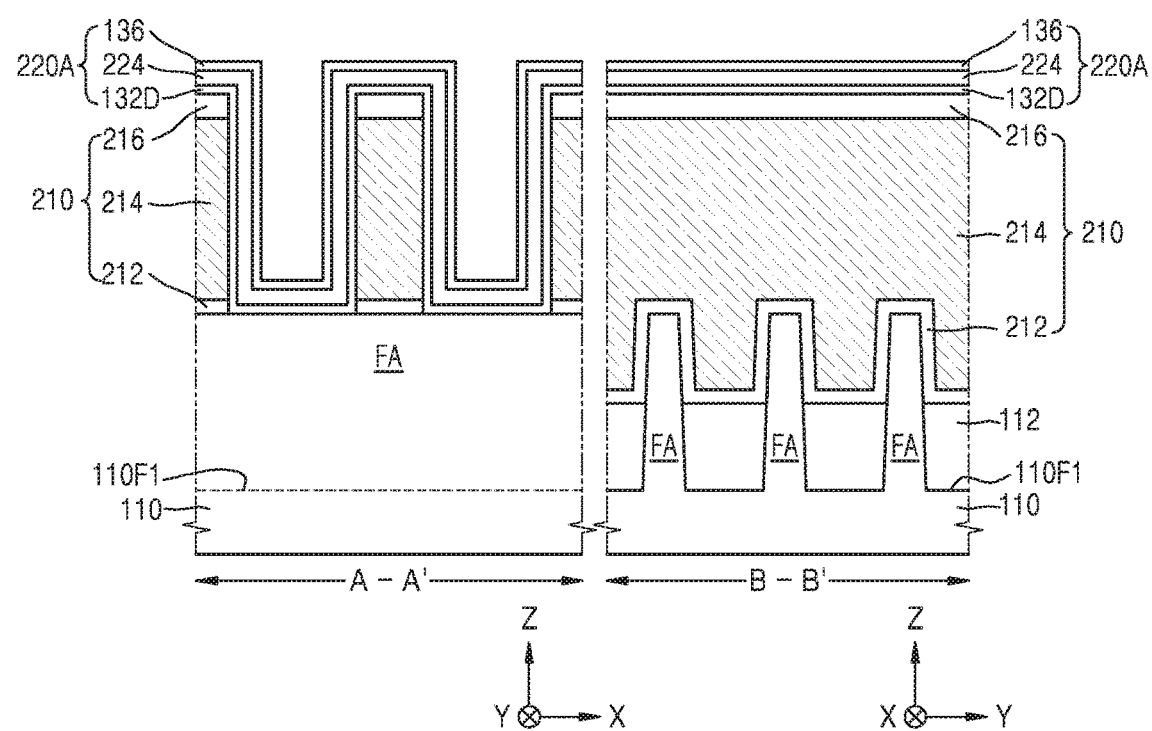
FIGS. 18 to 21 illustrate cross-sectional views showing a method of manufacturing an integrated circuit device, according to exemplary embodiments.

Referring to FIG. 18, the preliminary spacer 220A with multiple layers may be formed on the sacrificial gate structure 210. The preliminary spacer 220A may include the first spacer layer 132D, the second preliminary spacer layer 224 and the third spacer layer 136 sequentially stacked on the fin-type active region FA at both sides of the sacrificial gate structure 210 and the sacrificial gate structure 210.

In some embodiments, the first spacer layer 132D and the third spacer layer 136 may include a material having an etch selectivity with respect to the second preliminary spacer layer 224. For example, the first spacer layer 132D, the second preliminary spacer layer 224 and the third spacer layer 136 may be selected from silicon oxide, silicon oxynitride, silicon nitride, aluminum oxide, polysilicon, and the like.

Then, the processes described with reference to FIGS. 12 and 13 are performed to form the gate structure 120 and the first contact structure 140 and the second contact structure 150.

Figure 19:
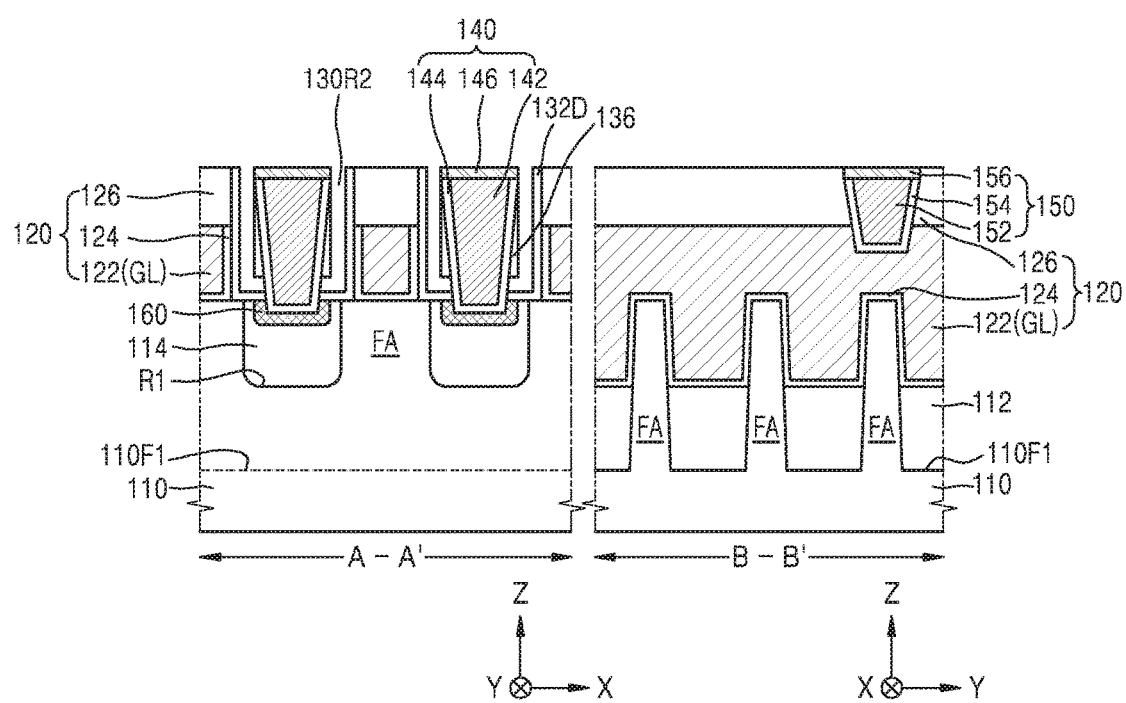

Referring to FIG. 19, the second preliminary spacer layer 224 is removed and thus, a recess region 130R2 may be formed between the first spacer layer 132D and the third spacer layer 136. The removal process may be a wet etching process or a dry etching process using the etch selectivity with respect to the second preliminary spacer layer 224 with respect to the first spacer layer 132D and the third spacer layer 136. Meanwhile, some portions of a side wall of the first contact structure 140 may also be exposed by the recess region 130R2.

Figure 20:
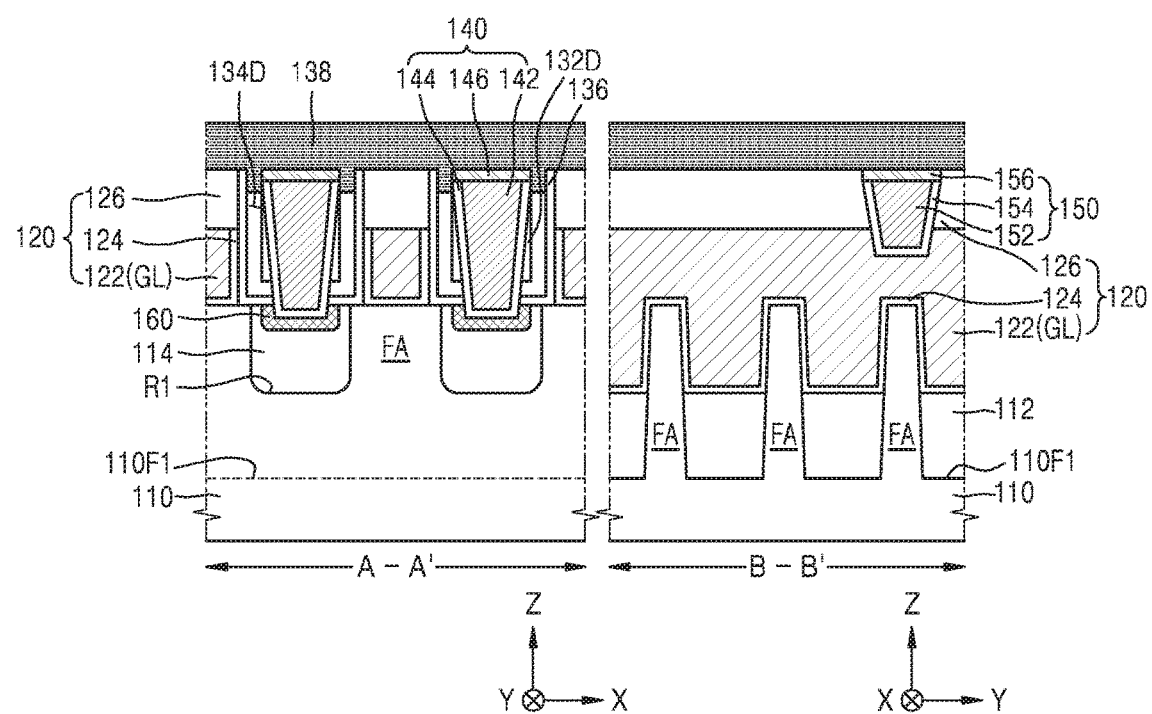

Referring to FIG. 20, the fourth spacer layer 138 covering an upper portion of the recess region 130R2 (see FIG. 19) may be formed on the first contact structure 140 and the second contact structure 150 and the gate structure 120 using an insulating material.

For example, the fourth spacer layer 138 may be formed using an insulating material having poor step coverage by a plasma enhanced CVD process. For example, the fourth spacer layer 138 may include, but is not limited to, silicon nitride. The fourth spacer layer 138 may not fully fill an inner portion of the recess region 130R2. An air space may remain inside the recess region 130R2. Here, the air space may be referred to as the second spacer layer 134D.

Figure 21:
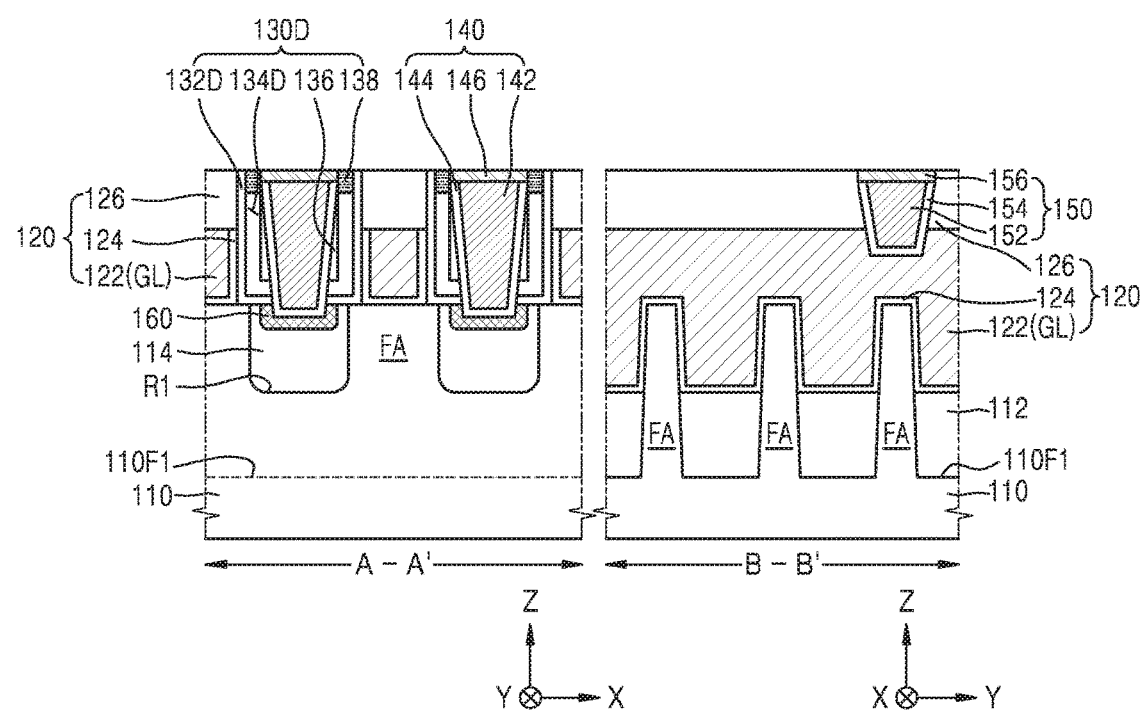

Referring to FIG. 21, an upper portion of the fourth spacer layer 138 may be planarized until upper surfaces of the first metallic capping layer 146 and the second metallic capping layer 156 are exposed. In this regard, the first spacer layer 132D, the second spacer layer 134D including an air space, the third spacer layer 136, and the spacer structure 130D including the fourth spacer layer 138 may be formed.

Then, the processes described with reference to FIG. 17 may be performed to manufacture the integrated circuit device 100D.

In some other embodiments, the second spacer layer 134F entirely filling an inner portion of the recess region 130R2 (see FIG. 19) may be formed on the first contact structure 140 and the second contact structure 150 and the gate structure 120 using an insulating material having excellent gap fill characteristics. In this case, an integrated circuit device 100F including the spacer structure 130F described with reference to FIG. 9 may be manufactured.

Figure 22:
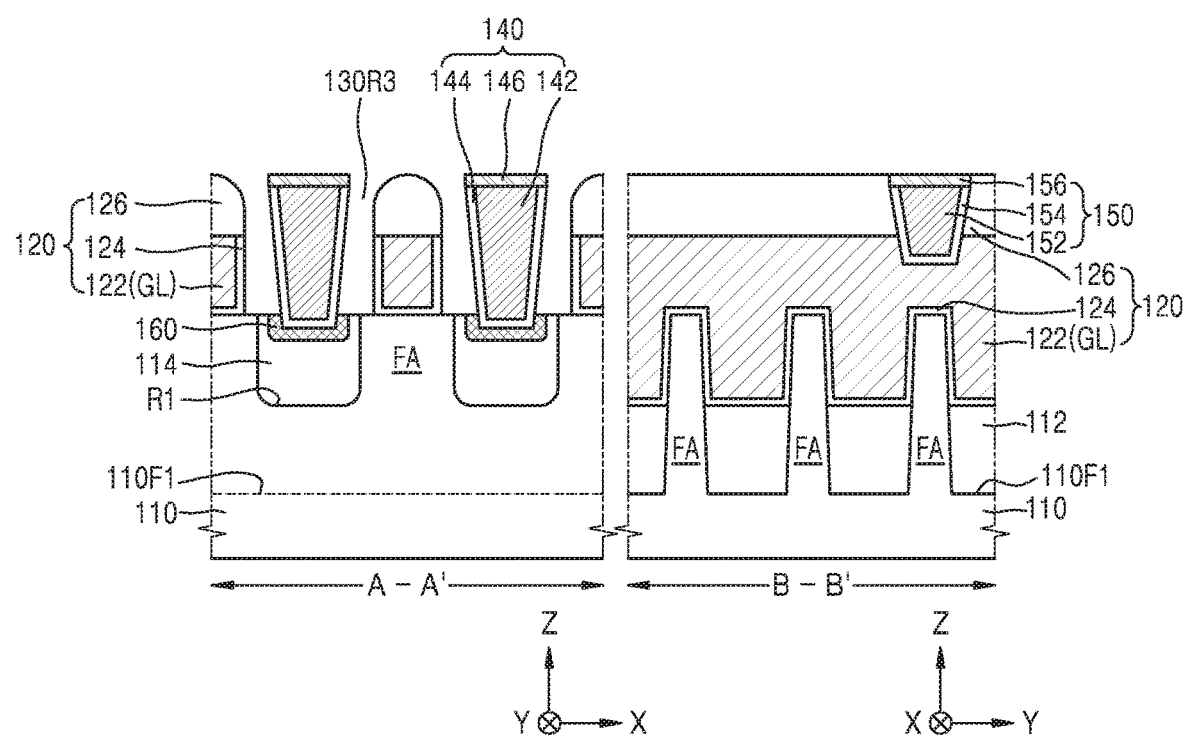
FIGS. 22 to 24 illustrate cross-sectional views showing a method of manufacturing an integrated circuit device, according to exemplary embodiments.
Figure 23:
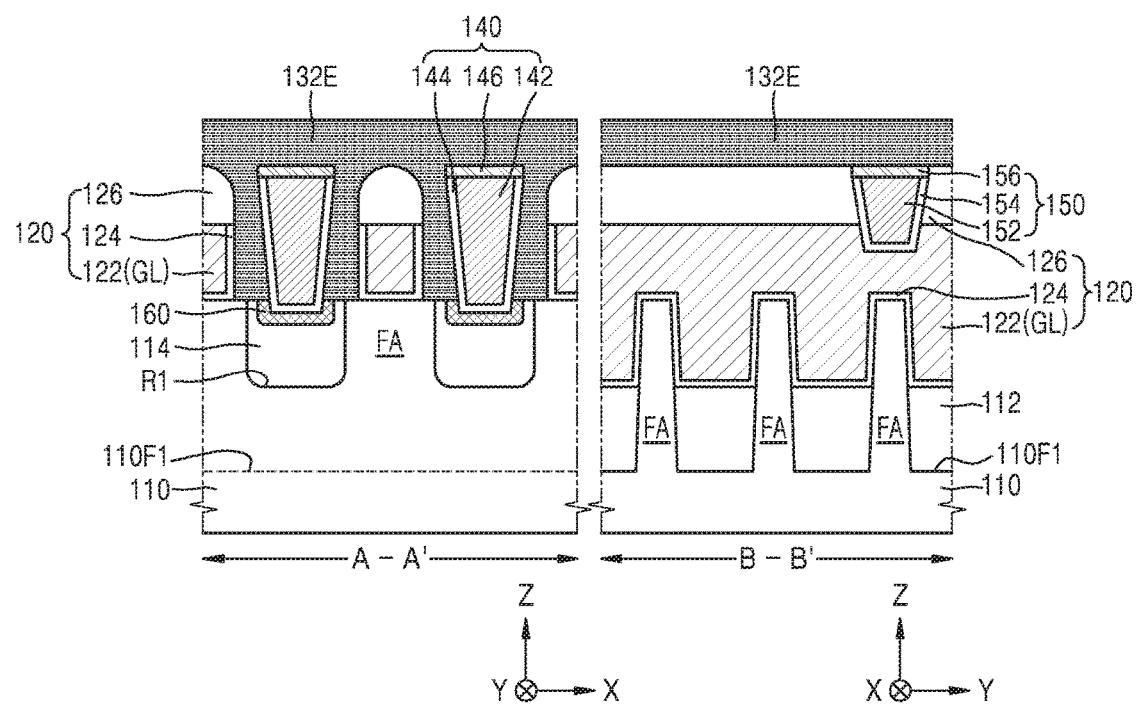
Figure 24:
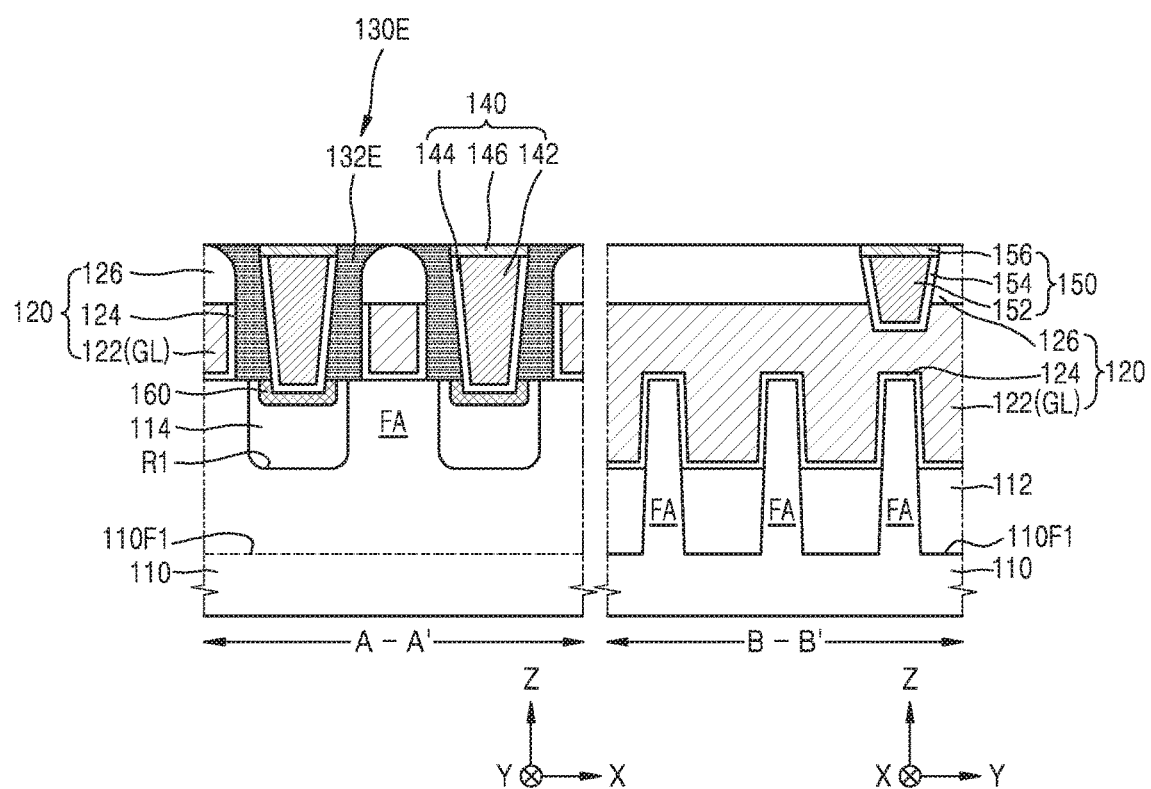

FIGS. 22 to 24 illustrate cross-sectional views showing a method of manufacturing of an integrated circuit device 100E according to exemplary embodiments.

The processes described with reference to FIGS. 11 and 12 are performed to form a structure in which the source/drain region 114, the gate structure 120, and an intergate insulating layer (not shown) between the gate structures 120 are formed.

Referring to FIG. 22, the gate capping layer 126 and the preliminary spacer 220 may be used as a self-aligned etch mask to etch the intergate insulating layer and thus, the first contact hole CPH1 exposing an upper surface of the source/drain region 114 may be formed.

In the removal process for forming the first contact hole CPH1, an upper portion of the gate capping layer 126 may be further consumed by a predetermined thickness to lower the height of the gate capping layer 126. A portion of the gate capping layer 126 disposed between two adjacent first contact holes CPH1 may be formed to have an upper surface protruded upward or a rounded upper surface.

Then, the processes described with reference to FIGS. 12 to 14 may be performed to form the first contact structure 140 and the second contact structure 150.

Then, the preliminary spacer 220 (see FIG. 13) may be removed and a space from which the preliminary spacer 220 is removed may be referred to as a recess region 130R3. As an edge portion of the gate capping layer 126 has a lower upper level, an upper portion of the recess region 130R3 may be extended (e.g., the recess region 130R3 may have a larger upper width than the recess region 130R1 described with reference to FIG. 14).

Referring to FIG. 23, the first spacer layer 132E filling an inner portion of the recess region 130R3 (see FIG. 22) using an insulating material on the first contact structure 140 and the second contact structure 150 and the gate structure 120.

The first spacer layer 132E may be formed using a low-k material having excellent gap fill characteristics. For example, the first spacer layer 132E may be formed using a spin coating process, a flowable chemical vapor deposition (FCVD) process, or the like. In some embodiments, the first spacer layer 132E may include an insulating material having a dielectric constant less than 3.9. For example, the first spacer layer 132E may include $SiO_xC_yN_z$, $SiC_xO_yH_z$, or $SiC_xN_y$.

Referring to FIG. 24, an upper portion of the first spacer layer 132E may be planarized until upper surfaces of the first metallic capping layer 146 and the second metallic capping layer 156 are exposed. As a result, the spacer structure 130E including a single layer of the first spacer layer 132E may be formed.

According to the aforementioned manufacturing method, in the removal process of the preliminary spacer 220 for forming the spacer structure 130E including a low-k material, the first metallic capping layer 146 and the second metallic capping layer 156 may act as a protection layer to prevent the first contact plug 142 and the second contact plug 152 from being oxidized or damaged. Thus, the integrated circuit device 100E manufactured according to the aforementioned method may provide a reliable electrical connection.

Figure 25:
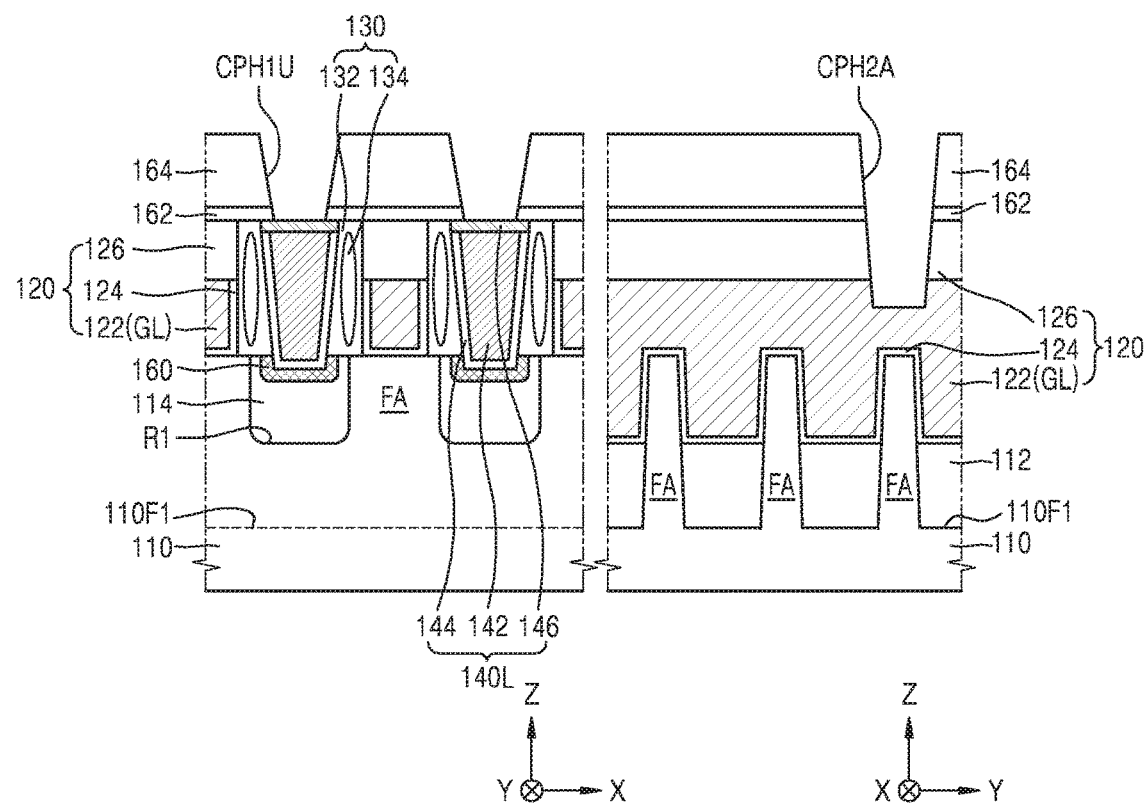
FIG. 25 illustrates a cross-sectional view showing a method of manufacturing an integrated circuit device, according to exemplary embodiments.

FIG. 25 illustrates a cross-section view showing a method of manufacturing an integrated circuit device 100G according to exemplary embodiments.

The processes described with reference to FIGS. 11 and 12 may be performed to form the first lower contact structure 140L. Here, the second contact hole CPH2A exposing an upper surface of the gate electrode 122 may not be formed.

Referring to FIG. 25, the etch stop layer 162 and the first insulating interlayer 164 may be sequentially formed on the gate structure 120, the spacer structure 130 and the first lower contact structure 140L. Then, the first upper contact hole CPH1U exposing an upper surface of the first lower contact structure 140L and the second contact hole CPH2A exposing an upper surface of the gate electrode 122 may be formed. The processes for forming the first upper contact hole CPH1U and the second contact hole CPH2A may be performed concurrently or sequentially.

Then, the first upper contact structure 140U and the second contact structure 150 respectively filling the first upper contact hole CPH1U and the second contact hole CPH2A may be formed.

While the inventive concepts of the present disclosure have been particularly shown and described with reference to embodiments thereof, it will be understood that various changes in form and details may be made therein without departing from the spirit and scope of the following claims.

What is claimed is:

1. An integrated circuit device, comprising:
   a substrate including a fin-type active region;
   a gate structure intersecting with the fin-type active region on the substrate, and with two sides and two side walls;
   a spacer structure disposed on both side walls of the gate structure, the spacer structure including:
      a first spacer layer contacting at least a portion of both side walls of the gate structure; and
      a second spacer layer disposed on the first spacer layer and having a lower dielectric constant than a dielectric constant of the first spacer layer;
   a source/drain region disposed on both sides of the gate structure; and
   a first contact structure electrically connected to the source/drain region, the first contact structure including:
      a first contact plug disposed on the source/drain region; and
      a first metallic capping layer disposed on the first contact plug.

2. The integrated circuit device of claim 1, wherein the first contact plug contacts a side wall of the spacer structure, and an upper surface of the first metallic capping layer is flush with an upper surface of the spacer structure.

3. The integrated circuit device of claim 1, wherein an upper surface of the first contact plug is at a level lower than a level of an upper surface of the spacer structure, and the first spacer layer surrounds a side wall of the first metallic capping layer.

4. The integrated circuit device of claim 1, wherein the first contact plug comprises a first metal and the first metallic capping layer comprises a second metal different from the first metal, and
   the first metallic capping layer entirely covers an upper surface of the first contact plug.

5. The integrated circuit device of claim 1, wherein the second spacer layer includes an air space,
   the first spacer layer surrounds an upper side wall of the gate structure and an upper side wall of the first contact plug, and
   the air space is defined by a lower side wall of the gate structure and a lower side wall of the first contact plug.

6. The integrated circuit device of claim 1, wherein the second spacer layer includes an air space,
the first spacer layer conformally extends along a side wall of the gate structure, and
the air space is disposed between the first spacer layer and at least a portion of a side wall of the first contact plug.

7. The integrated circuit device of claim 1, wherein the second spacer layer comprises $SiO_xC_yN_z$, $SiC_xO_yH_z$, or $SiC_xN_y$, or an insulating material having a dielectric constant less than 3.9.

8. The integrated circuit device of claim 1, wherein a side surface of the first metallic capping layer protrudes beyond a side surface of the first contact plug in at least one direction, and
the first spacer layer is disposed on the side surface of the first contact plug at a position where the first spacer layer overlaps the first metallic capping layer in at least one dimension.

9. The integrated circuit device of claim 1, further comprising
a second contact structure electrically connected to the gate structure, the second contact structure including:
a second contact plug disposed on the gate structure; and
a second metallic capping layer disposed on the second contact plug.

10. The integrated circuit device of claim 9, wherein an upper surface of the second metallic capping layer is flush with an upper surface of the first metallic capping layer.

11. An integrated circuit device, comprising:
a substrate including a fin-type active region;
a gate structure intersecting with the fin-type active region on the substrate, and with two sides and two side walls;
a spacer structure disposed on both side walls of the gate structure and including a low-k material;
a source/drain region disposed on both sides of the gate structure; and
a first contact structure electrically connected to the source/drain region, the first contact structure including a first contact plug disposed on the source/drain region and a first metallic capping layer disposed on the first contact plug,
wherein an upper surface of the spacer structure is at a level that is the same as a level of an upper surface of the first metallic capping layer.

12. The integrated circuit device of claim 11, wherein the spacer structure comprises:
a first spacer layer contacting at least a portion of both side walls of the gate structure; and
a second spacer layer disposed on the first spacer layer and having a dielectric constant lower than a dielectric constant of the first spacer layer.

13. The integrated circuit device of claim 11, wherein the low-k material comprises air or $SiO_xC_yN_z$, $SiC_xO_yH_z$, or $SiC_xN_y$, or an insulating material having a dielectric constant less than 3.9.

14. The integrated circuit device of claim 11, wherein the first metallic capping layer contacts a side wall of the spacer structure, and an upper surface of the first contact plug is at a level lower than a level of an upper surface of the spacer structure.

15. The integrated circuit device of claim 11, wherein a side surface of the first metallic capping layer protrudes beyond a side surface of the first contact plug in at least one direction, and
the spacer structure is disposed on the side surface of the first contact plug at a position where the spacer structure overlaps the first metallic capping layer in at least one dimension.

16. The integrated circuit device of claim 15, wherein the spacer structure surrounds the side surface that protrudes beyond the first metallic capping layer in at least one direction.

17. An integrated circuit device, comprising:
a substrate including a fin-type active region;
a gate structure intersecting with the fin-type active region on the substrate, and with two sides and two side walls;
a spacer structure disposed on both side walls of the gate structure and including a low-k material;
a source/drain region disposed on both sides of the gate structure;
a first contact structure electrically connected to the source/drain region, the first contact structure including a first contact plug disposed on the source/drain region and a first metallic capping layer disposed on the first contact plug; and
a second contact structure electrically connected to the gate structure, the second contact structure including a second contact plug disposed on the gate structure and a second metallic capping layer disposed on the second contact plug.

18. The integrated circuit device of claim 17, wherein an upper surface of the first metallic capping layer is flush with an upper surface of the second metallic capping layer.

19. The integrated circuit device of claim 17, wherein an upper surface of the first metallic capping layer is at a level lower than a level of an upper surface of the second metallic capping layer.

20. The integrated circuit device of claim 17, wherein the first metallic capping layer entirely covers an upper surface of the first contact plug, and
the spacer structure surrounds the first metallic capping layer and an upper surface of the spacer structure is flush with an upper surface of the first metallic capping layer.

* * * * *